(12) United States Patent
Sakata et al.

(10) Patent No.: US 7,388,400 B2
(45) Date of Patent: *Jun. 17, 2008

(54) SEMICONDUCTOR INTEGRATED CIRCUITS WITH POWER REDUCTION MECHANISM

(75) Inventors: Takeshi Sakata, Kunitachi (JP); Kiyoo Itoh, Higashikurume (JP); Masashi Horiguchi, Kawasaki (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/768,981

(22) Filed: Jun. 27, 2007

(65) Prior Publication Data

US 2007/0247186 A1 Oct. 25, 2007

Related U.S. Application Data

(60) Continuation of application No. 11/599,275, filed on Nov. 15, 2006, now Pat. No. 7,242,214, which is a continuation of application No. 11/004,823, filed on Dec. 7, 2004, now Pat. No. 7,023,237, which is a continuation of application No. 10/626,532, filed on Jul. 25, 2003, now Pat. No. 6,838,901, which is a division of application No. 10/103,966, filed on Mar. 25, 2002, now Pat. No. 6,621,292, which is a continuation of application No. 09/832,853, filed on Apr. 12, 2001, now Pat. No. 6,384,623, which is a continuation of application No. 09/573,609, filed on May 19, 2000, now Pat. No. 6,268,741, which is a continuation of application No. 09/141,563, filed on Aug. 28, 1998, now Pat. No. 6,154,062, which is a continuation of application No. 08/797,051, filed on Feb. 10, 1997, now Pat. No. 5,825,198, which is a continuation of application No. 08/620,686, filed on Mar. 21, 1996, now Pat. No. 5,606,265, which is a continuation of application No. 08/374,990, filed on Jan. 19, 1995, now Pat. No. 5,521,527, which is a continuation of application No. 08/178,020, filed on Jan. 6, 1994, now Pat. No. 5,408,144.

(30) Foreign Application Priority Data

Jan. 7, 1993 (JP) ............................. 5-000973
Feb. 2, 1993 (JP) ............................. 5-015236

(51) Int. Cl.
*H03K 19/003* (2006.01)
*H03K 17/16* (2006.01)

(52) U.S. Cl. ..................... 326/34; 326/98; 326/21; 365/226

(58) Field of Classification Search ............. 326/34, 326/21, 95–98; 327/544; 365/226
See application file for complete search history.

(56) References Cited

U.S. PATENT DOCUMENTS

| | | | |
|---|---|---|---|
| 4,209,713 A | 6/1980 | Satou et al. | |
| 4,710,648 A | 12/1987 | Hanamura et al. | |
| 4,718,043 A | 1/1988 | Akatsuka | |
| 4,730,133 A | 3/1988 | Yoshida | |
| 4,772,811 A | 9/1988 | Kujioka et al. | |
| 4,825,106 A | 4/1989 | Tipon et al. | |
| 4,920,282 A | 4/1990 | Muraoka et al. | |
| 5,197,033 A | 3/1993 | Watanabe et al. | |
| 5,274,601 A | 12/1993 | Kawahara et al. | |
| 5,297,097 A | 3/1994 | Etoh et al. | |
| 5,396,128 A | 3/1995 | Dunning et al. | |
| 5,486,774 A | 1/1996 | Douseki et al. | |
| 5,526,313 A | 6/1996 | Etoh et al. | |
| 5,541,885 A | 7/1996 | Takashima | |
| 5,557,620 A | 9/1996 | Miller, Jr. et al. | |
| 5,583,457 A | 12/1996 | Horiguchi et al. | |

FOREIGN PATENT DOCUMENTS

| | | |
|---|---|---|
| JP | 60-48525 | 3/1985 |
| JP | 6-208790 | 7/1994 |

*Primary Examiner*—Daniel D Chang
(74) *Attorney, Agent, or Firm*—Antonelli, Terry, Stout & Kraus, LLP.

(57) ABSTRACT

A semiconductor integrated circuit with an operating voltage having an absolute value is 2.5 V or below includes circuit blocks to which operation voltage is supplied by first and

THIS INVENTION second power lines and a first switching element for each circuit block. Each circuit block includes a first MOS transistor in which a leakage current flows even under a condition that a gate voltage is equal to a source voltage. Each of the first switching elements controls the leakage current flowing through a corresponding first MOS transistor of each circuit block. Also, while one of the first switching elements is controlled to reduce the leakage current flowing through the circuit block relating to one of the first switching elements, another one of the first switching elements is controlled to allow current to flow through the circuit block relating to another one of the first switching elements. In addition, current which is allowed to flow by the another one of the first switching elements is sufficient to permit the circuit block relating to another one of the first switching elements to logically operate.

4 Claims, 25 Drawing Sheets

THIS INVENTION

CHIP

SEMICONDUCTOR INTEGRATED CIRCUITS WITH POWER REDUCTION MECHANISM

CROSS-REFERENCE TO RELATED APPLICATIONS

This is a Continuation of application Ser. No. 11/599,275, filed Nov. 15, 2006, now U.S. Pat. No. 7,242,214 which is a Continuation of application Ser. No. 11/004,823, filed Dec. 7, 2004 (now U.S. Pat. No. 7,023,237), which is a Continuation of application Ser. No. 10/626,532, filed Jul. 25, 2003 (now U.S. Pat. No. 6,838,901), which is a Continuation of application Ser. No. 10/103,966, filed Mar. 25, 2002 (now U.S. Pat. No. 6,621,292), which is a Divisional of application Ser. No. 09/832,853, filed Apr. 12, 2001 (now U.S. Pat. No. 6,384,623); which is a Continuation of application Ser. No. 09/573,609, filed May 19, 2000 (now U.S. Pat. No. 6,268,741); which is a Continuation of application Ser. No. 09/141,563, filed on Aug. 28, 1998 (now U.S. Pat. No. 6,154,062); which is a Continuation of application Ser. No. 08/797,051, filed on Feb. 10, 1997 (now U.S. Pat. No. 5,825,198); which is a Continuation of application Ser. No. 08/620,686, filed Mar. 21, 1996 (now U.S. Pat. No. 5,606,265); which is a Continuation of application Ser. No. 08/374,990, filed on Jan. 19, 1995 (now U.S. Pat. No. 5,521,527); which is a Continuation of application Ser. No. 08/178,020, filed on Jan. 6, 1994 (now U.S. Pat. No. 5,408,144), the entire disclosures of which are hereby incorporated by reference.

BACKGROUND OF THE INVENTION AND SUMMARY OF THE INVENTION

The present invention relates to semiconductor integrated circuits suitable for high-speed and low-power operation, and particularly to a semiconductor integrated circuit formed of small-geometry MOS transistors.

The semiconductor integrated circuits have so far been developed toward the scaling down of MOS transistors. However, since the minute structure of MOS transistors reduces their breakdown voltage the more as the degree of the minuteness becomes greater, the operating voltage of the small-geometry MOS transistors must be lowered, as described in International Symposium on VLSI Technology, Systems and Applications, Proceedings of Technical Papers, pp. 188-192 (May 1989). The operating voltages of the semiconductors used in the battery-operated portable electronic apparatus must be further reduced for their low power consumption.

In order to maintain their high-speed operation under reduced operating voltages, it is also necessary to decrease the threshold voltage (VT) of the MOS transistors. The reason for this is that the operating speed is governed by the effective gate voltage of the MOS transistors, or the remainder of the subtraction of VT from the operating voltage, or that it increased with the increase of this effective gate voltage. For example, in a 16-gigabit DRAM which is expected to have 0.15 μm or below in effective channel length, about 4 nm in gate oxide film thickness, 1 V in standard operating voltage within chip and about 1.75 V in boosted word line voltage, the constant current threshold voltage of transistors is calculated to be −0.04 V. The term, constant current threshold voltage of transistors is the gate-source voltage under the conditions of a ratio, 30 of effective channel width to effective channel length and a drain current of 10 nA. In this case, the substrate-source voltage is 0, the junction temperature is 25° C. and a typical condition is assumed. For simplicity, the threshold voltage of p-channel MOS transistors is shown with the opposite sign.

When $V_T$ is reduced, however, the drain current cannot be completely cut off due to the drain current characteristic of the subthreshold region of MOS transistors. This problem will be described with reference to FIG. 22A which shows a conventional CMOS inverter. When the input signal IN to the CMOS inverter has a low level (=$V_{ss}$), the n-channel MOS transistor $M_N$ is turned off. When the input signal IN has a high level (=$V_{cc}$), the p-channel MOS transistor $M_P$ is turned off. Therefore, in either case, from the ideal point of view, no current flows from the high source voltage $V_{cc}$ through the CMOS inverter to the low source voltage $V_{ss}$, or ground potential.

When the threshold voltage $V_T$ of the MOS transistors is reduced, however, the subthreshold characteristic cannot be neglected. As shown in FIG. 22B, the drain current $I_{DS}$ in the subthreshold region is proportional to the exponential function of the gate-source voltage $V_{GS}$, and expressed by the following equation (1).

$$I_{DS} = I_0 \cdot \frac{W}{W_0} \cdot 10^{\frac{V_{GS}-V_T}{S}} \quad (1)$$

where W is the channel width of the MOS transistors, $I_0$ and $W_0$ are the current value and channel width used when $V_T$ is defined, and S is the subthreshold swing (the reciprocal of the gradient of the $V_{GS}$-log $I_{DS}$ characteristic). Thus, the drain current in the subthreshold region (, or the subthreshold current) flows even under $V_{GS}$=0. The subthreshold current can be expressed by the following equation (2).

$$I_L = I_0 \cdot \frac{W}{W_0} \cdot 10^{-\frac{V_T}{S}} \quad (2)$$

When the input signal to the CMOS inverter shown in FIG. 22A is not changed, or when it is not operated, the off-state transistor of the CMOS inverter is at $V_{GS}$=0. Therefore, the current flowing from the high source voltage $V_{cc}$ through the CMOS inverter to the low source voltage $V_{ss}$, or ground potential is the current $I_L$ which flows in the off-state transistor of the CMOS inverter.

This subthreshold current, as shown in FIG. 22B, is exponentially increased from $I_L$ to $I_L'$ when the threshold voltage is decreased from $V_T$ to $V_T'$.

Although the increase of $V_T$ or the reduction of S reduce the subthreshold current as will be seen from the equation (2), the increase of $V_T$, incurs the reduction of the speed due to the decrease of the effective gate voltage, while the reduction of S will be difficult for the following reason.

The subthreshold swing S can be expressed by using the capacitance $C_{OX}$ of the gate dielectric and the capacitance $C_D$ of the depletion region under the gate as in the following equation (3).

$$S = \frac{k \cdot T \cdot \ell_n 10}{q} 1 + \frac{C_D}{C_{OX}} \quad (3)$$

where k is the Boltzmann constant, T is the absolute temperature and q is the elementary charge. As will be seen from the equation (3), the condition of $S \geq kT\,l_n\,10/q$ is limited for any values of $C_{OX}$ and $C_D$. Thus, it is difficult for S to be reduced to 60 mV or below at room temperature (about 300 k).

Thus, in the semiconductor integrated circuit including MOS transistors with a low value of $V_T$ the amount of DC current consumption of non-operating circuits is remarkably increased because of the phenomenon mentioned above when the operating voltage becomes low (for example, 2 V or 2.5 V). Particularly, upon high-temperature operation, S becomes large, making this problem further serious. In the downsizing age of future computers and so on, when reduction of power is important, the increase of the subthreshold current becomes a substantial problem.

This problem will be further considered taking a memory, which is a typical semiconductor integrated circuit, as an example. The memory generally includes, as shown in FIG. 23, a memory array MA, an X decoder (XDEC) and word driver (WD) for selecting and driving a row line (word line W) for the selection of a memory cell MC within the memory array MA, a sense amplifier (SA) for amplifying the signal on a column line (data line D), a sense amplifier driving circuit (SAD) for driving the sense amplifier, a Y decoder (YDEC) for selecting a column line, and a peripheral circuit (PR) for controlling these circuits. The main parts of these circuits are designed based on the CMOS inverter logic circuit mentioned above.

When the threshold voltage $V_T$ of transistors (hereinafter, for simplicity the absolute values of the threshold voltages of the p-channel and n-channel MOS transistors are assumed to be equal to $V_T$) is low, a subthreshold current, that is a current flowing in the source-drain path of the MOS transistors of which the $V_{GS}$, is substantially 0.

Therefore, the sum of the subthreshold currents becomes particularly great in the circuits having a large number of MOS transistors, such as decoders, drivers or the peripheral circuit section.

For example, in the decoders or drivers, a small number of particular circuits are selected from a large number of circuits of the same type by the address signal, and driven. FIG. 24 shows an example of the conventional word driver for DRAM.

If the threshold value $V_T$ of the MOS transistors of all CMOS drivers #1-#r is large enough, the subthreshold current, that is a current flowing in the source-drain paths of the MOS transistors of substantially zero $V_{GS}$, is substantially zero in each of a large number of nonselected circuits. In general, the number of the decoder and driver is increased with the increase of the storage capacity of the memory. However, even though the storage capacity is increased, the total current is not increased unless the subthreshold current flows in the circuits that are not selected in the decoders or drivers.

If the threshold voltage $V_T$ is decreased as mentioned above, however, the subthreshold current increases in proportion to the number of nonselected circuits.

In the prior art, when the chip is in the standby mode (nonselected state), almost all the circuits within the chip are turned off so that the power dissipation can be reduced as much as possible. However, it is not possible any more to reduce the power current dissipation even in the standby mode because the subthreshold current flows when the MOS transistors are highly scaled down.

When $V_T$ is small, the subthreshold current that is a current flowing in the source-drain paths of the MOS transistors with $V_{GS}$ being substantially zero, causes a trouble not only in the standby mode but also in the operating mode. Generally the current $I_{ACT}$ flowing when the chip is in the active mode and the current $I_{STB}$ flowing when the chip is in the standby mode are respectively expressed by $$I_{ACT} \approx I_{OP} + I_{DC}, \text{ and}$$

$$I_{STB} \approx I_{DC}$$

where $I_{OP}$ is the charging and discharging current to and from the load capacitance of the circuits within the chip, and given by $$I_{OP} = C_{TOT} \cdot V_{cc} \cdot f$$

in which $V_{cc}$ is the operating voltage of the chip, $C_{TOT}$ is the total load capacitance of the circuits within the chip, and f is the operating frequency. In addition, $I_{DC}$ is the subthreshold current given above. The subthreshold current is exponentially increased with the decrease of $V_T$ as indicated by the equation (2).

So far, since $V_{cc}$ is large and $V_T$ is also large enough, the condition of $$I_{OP} > I_{DC}$$

can be satisfied. Therefore, the following equations can be given:

$$I_{ACT} \approx I_{OP},$$

$$I_{STB} \approx I_{DC}$$

In this case, $I_{DC}$ is substantially zero. Thus, for $I_{ACT}$, only the increase of $I_{OP}$ has been considered to cause a problem.

However, since $I_{DC}$ is increased with the decrease of $V_{cc}$ and $V_T$, finally the following condition is satisfied:

$$I_{OP} \leq I_{DC}$$

In addition, it is found that if $V_{cc}$ and $V_T$ are decreased, the following condition is given:

$$I_{OP} < I_{DC}$$

In this case, the expressions of $$I_{ACT} \approx I_{DC},$$

$$I_{STB} \approx I_{DC}$$

can be given. Therefore, the increase of the subthreshold current $I_{DC}$ also becomes a problem to the current $I_{ACT}$ which flows when the chip is operating.

FIG. 25 shows an example of the results predicted for the current dissipation in the DRAM. This prediction is made at a junction temperature of 75° C. with typical conditions. From FIG. 25, it will be seen that the $I_{DC}$ of the 4-G bit DRAM exceeds $I_{OP}$ when its operating voltage is assumed to be 1.2 V.

If we considers the worst conditions, the subthreshold current $I_{DC}$ causes a problem even when the effective channel length, gate oxide film thickness and operating voltage are respectively about 0.25 μm, 6 nm and 2.5 V. Here, the values corresponding to a 256-M bit DRAM are used. In the prior art, when the operating voltage is 3.3 V, the constant current threshold voltage defined as the gate-source voltage of the transistor of which the ratio of the effective channel width to effective channel length is 30 and in which the drain current is 10 nA is one tenth of the operating voltage, or 0.33 V at a substrate-source voltage of 0 volt and a junction temperature of 25° C. with typical conditions. At this time, the extrapolated threshold voltage defined as the gate-source voltage when the drain current characteristic of a saturated region is extrapolated for zero current is about 0.2 V higher than the constant current threshold voltage, or about 0.53 V. When the operating voltage is reduced to 2.5 V, the extrapolated threshold voltage is reduced to about 0.4 V in proportion to the operating voltage in order to assure the effective gate voltage. Since the difference between the extrapolated threshold voltage and the constant current threshold voltage is substantially constant, the constant current threshold voltage is about 0.2 V. In addition, the temperature dependency of the threshold voltage must be considered. In general, when the operation of the chip at room temperature is assured, it must be guaranteed at a normal ambient temperature $T_a$ of 0° C. through 70° C. Moreover, the junction temperature $T_j$ within the chip can be found from the equation of $$T_j = T_a + \theta_{ja} \cdot P_d$$

where $P_d$ is the dissipation power, and $\theta_{ja}$ is the thermal conductivity of the chip, and thus a higher temperature must be considered. If the source voltage and the active current $I_{ACT}$ are 2.5 V and 50 mA, respectively, and if $T_a$ is 75° C. including a margin when $\theta_{ja}$ is 200° C./W, the junction temperature $T_j$ is 100° C. The constant current threshold voltage at this value of $T_j$ is about 0.1 V when the temperature dependency of the threshold voltage is assumed to be −1.6 mV/° C. In addition, if we consider the threshold voltage variation due to the process dispersion as 0.1 V, the constant current threshold voltage with 10 nA at the worst condition is about 0.0 V. In this case, if the effective gate length is 0.25 μm, the gate width which is used when defining the constant current threshold voltage is about 7.5 μm. If the total value of gate widths of the MOS transistors within the chip which contributes to $I_{DC}$ is about 4 m, the subthreshold current $I_{DC}$ is found to be 5 mA from the equation (2) when the subthreshold swing S is 100 mV/dec. This value of 5 mA corresponds to one tenth of $I_{ACT}$ as assumed above, and is thus too large to be neglected. Therefore, when the operating voltage is about 2.5 V or below, the subthreshold current in the CMOS logic circuit causes a problem.

We now consider the dissipation power of a CMOS LSI which is demanded for its application. The dissipation power in the LSI used in portable apparatus should be treated as the average dissipation power in the period of time in which it is energized and thus it includes both the standby current and the active current. Particularly in the battery-operated apparatus, both the currents are important because the idle time is determined by the average dissipation power. There are a number of LSIs which keep operating almost within the period of time in which they are energized, such as IC processors, memories and ASICs for high-speed operation. In these LSIs, only the active current is important, and thus the condition of $I_{ACT} \approx I_{STB}$ may be allowed. In either case, the reduction of $I_{ACT}$ is an important subject in all LSIs. In the prior art, since $I_{DC}$ is dominant for $I_{ACT}$ in the near future as described above, it becomes important to reduce the leakage (penetrating) current flowing through the CMOS LSI in the active mode.

Accordingly, it is an object of the invention to provide a semiconductor integrated circuit capable of reducing the dissipation power of the semiconductor integrated circuit including circuits which have enhancement type MOS transistors which operate at an operating voltage of 2.5 V or below and which cause a significant current in the source-drain path when $V_{GS}$ is substantially zero.

It is another object of the invention to reduce the subthreshold current of the MOS transistors included in the word driver, decoder, sense amplifier driving circuit and so on of a memory or a semiconductor integrated circuit in which the memory is incorporated.

In order to achieve the above objects, when some circuits of the semiconductor integrated circuit are operated to change their outputs, the subthreshold current of the MOS transistors in the other circuits which are not changed in their outputs is reduced so that the dissipation power can be decreased.

More specifically, according to this invention, there is provided a semiconductor integrated circuit chip operating at an operating voltage of 2.5 V or below, comprising:

a first terminal at which a first operating potential is applied;

a second terminal at which a second operating potential is applied;

a first circuit block coupled between the first terminal and the second terminal; and a second circuit block coupled between the first terminal and the second terminal;

wherein the first circuit block permits an active current to flow between the first terminal and the output terminal when the first circuit block responds to an input signal to its input terminal to produce an output signal at its output terminal, wherein the second circuit block includes a plurality of subcircuit blocks each of which includes a MOS transistor having its source connected to a first node and its gate connected to the input terminal and a load having one end connected to the drain of the MOS transistor and the other end connected to a second node, wherein the MOS transistor of each of the plurality of subcircuit blocks causes a subthreshold current in its source-drain path when the gate-source voltage is substantially 0, wherein the plurality of first nodes of the plurality of subcircuit blocks are coupled through a plurality of switching elements to the first terminal, and the plurality of second nodes of the plurality of subcircuit blocks are coupled to the second terminal, wherein constants of said plurality of switching elements are set so that the leak currents of the plurality of switching elements in their off-state are smaller than the subthreshold current of the MOS transistor of the corresponding one of said plurality of subcircuit blocks, and wherein the current dissipation in each of the plurality of subcircuit blocks of the second circuit block is limited to a leak current value of the corresponding one of the plurality of switching elements by turning off the plurality of switching elements so that the sum of the current dissipations in the plurality of subcircuit blocks is made smaller than the active current of the first circuit block.

Therefore, even when the-semiconductor integrated circuit chip is active, the first circuit block operates within the chip, while the subthreshold current in the non-active second circuit block can be reduced.

In addition, according to this invention, there is provided a semiconductor integrated circuit chip operating at an operating voltage of 2.5 V or below, comprising:

a first terminal at which a first operating potential is applied;

a second terminal at which a second operating potential is applied;

a first circuit block coupled between the first terminal and the second terminal; and a second circuit block coupled between the first terminal and the second terminal;

wherein the first circuit block permits an active current to flow between the first terminal and the output terminal when the first circuit responds to an input signal to its input terminal to produce an output signal at its output terminal, wherein the second circuit block includes a plurality of subcircuit blocks each of which includes a MOS transistor having its source connected to a first node and its gate connected to the input terminal and a load having one end connected to the drain of the MOS transistor and the other end connected to a second node, wherein the MOS transistor of each of the plurality of subcircuit blocks causes a subthreshold current to flow in its source-drain path when the gate-source voltage is substantially 0, wherein the plurality of first anodes of the plurality of subcircuit blocks are coupled through a plurality of switching elements to the first terminal, and the plurality of second nodes of the plurality of subcircuit blocks are coupled to the second terminal, wherein constants of said plurality of switching elements are set so that the leak currents of said plurality of switching elements in their off-state are smaller than the subthreshold current of the MOS transistor of the corresponding one of said plurality of subcircuit blocks, and wherein the current dissipation in each of the plurality of subcircuit blocks of the second circuit block is limited to a leak current value of the corresponding one of the plurality of switching elements by turning off the plurality of switching elements so that the sum of the current dissipations in the plurality of subcircuit blocks is made smaller than the active current of the first circuit block, wherein each of the plurality of subcircuit blocks of the second circuit block causes an active current to flow between the first terminal and the output terminal of each of the subcircuit blocks when each subcircuit responds to an input signal to its input terminal to produce an output signal at its output, wherein the first circuit block includes a plurality of subcircuit blocks, each of which includes a MOS transistor having its source connected to the first anode and its gate connected to the input terminal, and a load having its one end connected to the drain of the MOS transistor and the other end connected to the second anode, wherein the MOS transistor of each of the plurality of subcircuit blocks of the first circuit block causes the subthreshold current to flow in its source-drain path when the gate-source voltage is substantially 0, wherein the plurality of first anodes of the plurality of subcircuit blocks of the first circuit block are coupled through the plurality of switching elements to the first terminal, and the plurality of second anodes of the plurality of subcircuit blocks of the first circuit block are coupled to the second terminal, wherein the constants of the plurality of switching elements of the first circuit block are fixed so that the leak currents of the plurality of switching elements of the first circuit block in their off-state are smaller than the threshold current of the MOS transistor of the corresponding one of the plurality of subcircuit blocks of the first circuit block, and wherein the plurality of subcircuit blocks of the second circuit block are made active by turning on the plurality of switching elements of the second circuit block, and the current dissipation in each of the plurality of subcircuit blocks of the first circuit block is limited to a leak current value of the corresponding one of the plurality of switching elements by turning off the plurality of switching elements of the first circuit block so that the sum of the current dissipations in the plurality of subcircuit blocks is made smaller than that of the active currents of the second circuit block.

Therefore, when the semiconductor integrated circuit chip is active, the first circuit block within the chip is operated, while the subthreshold current in the second non-active circuit block can be reduced. In addition, while the second circuit block is operated within the chip, the subthreshold current in the first non-active circuit block can be reduced.

Moreover, according to this invention, there is provided a semiconductor integrated circuit chip comprising:

a plurality of first circuit blocks;

a plurality of first switching elements;

a first operation potential power line coupled common to the plurality of first switching elements; and a second switching element-coupled between the first operation potential power line and a first operation potential point, wherein each of a plurality of first nodes of the plurality of first circuit block is coupled to the first operation potential power line through the corresponding one of the plurality of first switching elements, wherein a plurality of second nodes of the plurality of first circuit blocks are coupled to a second operation potential power line, wherein each of the plurality of first circuit blocks includes a MOS transistor having its source connected to the corresponding one of the first nodes and its gate connected to an input terminal, and a load having its one end connected to an drain of the MOS transistor and the other end connected to the corresponding one of the second nodes, wherein the MOS transistor of each of the plurality of first circuit blocks causes a subthreshold current to flow in its source-drain path when the gate-source voltage is substantially 0, wherein constants of the plurality of first switching elements are set so that the leak current of each of the plurality of first switching elements in its off-state is smaller than the subthreshold current of the MOS transistor of the corresponding one of the plurality of first circuit blocks, wherein the current dissipation of each of the plurality of first circuit blocks is limited to a leak current value of a corresponding one of the plurality of first switching elements by turning off the plurality of first switching elements, and wherein a constant of the second switching element is set so that the leak current of the second switching element in its off-state is smaller than the sum of the leak currents of the plurality of first switching elements, and thus the sum of current dissipations in the plurality of first circuit blocks is limited to the leak current value of the second switching element.

Therefore, the current dissipation of each of the plurality of first circuit blocks in the standby mode is limited to the subthreshold current of the first switching elements or below. In addition, the sum of the current dissipations in the plurality of first circuit blocks coupled to the first operation potential line in the standby mode is limited to the subthreshold current of the second switching element or below.

Also, according to this invention, there is provided a semiconductor integrated circuit chip comprising:

a first terminal at which a first operating potential is applied;

a second terminal at which a second operating potential is applied;

a first circuit block coupled between the first terminal and the second terminal; and a second circuit block coupled between the first terminal and the second terminal;

wherein the first circuit block permits an active current to flow between the first terminal and the output terminal when the first circuit block responds to an input signal to its input terminal to produce an output signal at its output terminal, wherein the second circuit block includes a plurality of subcircuit blocks each of which includes a MOS transistor having its source connected to a first node and its gate connected to the input terminal and a load having one end connected to the drain of the MOS transistor and the other end connected to a second node, wherein the MOS transistor of each of the plurality of subcircuit blocks causes a subthreshold current to flow in its source-drain path when the gate-source voltage is substantially 0, wherein the plurality of first anodes of the plurality of subcircuit blocks are coupled through a plurality of switching elements to the first terminal, and the plurality of second nodes of the plurality of subcircuit blocks are coupled to the second terminal, wherein constants of said plurality of switching elements are set so that the leak currents of said plurality of switching elements in their off-state are smaller than the subthreshold current of the MOS transistor of the corresponding one of said plurality of subcircuit blocks, and wherein the current dissipation in each of the plurality of subcircuit blocks of the second circuit block is limited to a leak current value of the corresponding one of the plurality of switching elements by turning off the plurality of switching elements so that the sum of the current dissipations in the plurality of subcircuit blocks is made smaller than the active current of the first circuit block, wherein each of the plurality of subcircuit blocks of the second circuit block causes an active current to flow between the first terminal and the output terminal of each of the subcircuit blocks when each of the subcircuit blocks of the second circuit block responds to an input signal to its input terminal to produce an output signal at its output, wherein the first circuit block includes a plurality of subcircuit blocks, each of which includes a MOS transistor having its source connected to the first anode and its gate connected to the input terminal, and a load having its one end connected to the drain of the MOS transistor and the other end connected to the second anode, wherein the MOS transistor of each of the plurality of subcircuit blocks of the first circuit block causes the subthreshold current to flow in its source-drain path when the gate-source voltage is substantially 0, wherein the plurality of first anodes of the plurality of subcircuit blocks of the first circuit block are coupled through a plurality of switching elements to the first terminal, and the plurality of second anodes of the plurality of subcircuit blocks of the first circuit block are coupled to the second terminal, wherein the constants of the plurality of switching elements of the first circuit block are fixed so that the leak currents of the plurality of switching elements of the first circuit block in their off-state are smaller than the threshold current of the MOS transistor of the corresponding one of the plurality of subcircuit blocks of the first circuit block, and wherein the plurality of subcircuit blocks of the second circuit block are made active by turning on the plurality of switching elements of the second circuit block, and the current dissipation in each of the plurality of subcircuit blocks of the first circuit block is limited to a leak current value of the corresponding one of the plurality of switching elements by turning off the plurality of switching elements of the first circuit block so that the sum of the current dissipations in the plurality of subcircuit blocks is made smaller than that of the active currents of the second circuit block.

Therefore, as described above, the sum of the dissipation currents of the plurality of first circuit blocks coupled to the first operation potential line in the standby mode is limited to the subthreshold current of the second switching element or below, and the sum of the dissipation currents of the plurality of second circuit blocks coupled to the third operation potential line in the standby mode is limited to the subthreshold current of the fourth switching element or below. The total sum of the sum of the dissipation currents in the plurality of first circuit blocks and the sum of the dissipation currents in the plurality of second circuit blocks is limited to the subthreshold current of the fifth switching element or below.

The concept common to the semiconductor integrated circuit chips given in the summary of the invention is to have a plurality of circuit blocks and at least two circuit terminals through which a desired operating voltage is applied to these circuit blocks, and to have current control means provided for the subthreshold currents in the circuit blocks between each of the circuit blocks and at least one of the circuit terminals, so that the leakage current in a certain one of the circuit blocks is controlled by the current control means during a period including part of the time in which at least another one of the circuit blocks logically operates. Thus, when the semiconductor integrated circuit chip itself is in the operating state, during the period in which a certain one of the circuit blocks is operated, the leakage current in another non-operated one of the circuit blocks can be reduced. As a result, it is possible to reduce the total leakage current of the semiconductor integrated circuit chip in the active mode.

Therefore, even if the threshold voltage of the MOS transistor is decreased as it is scaled down, the leakage current flowing in the nonselected circuit can be minimized.

DESCRIPTION OF THE PREFERRED EMBODIMENTS

Figure 22A:
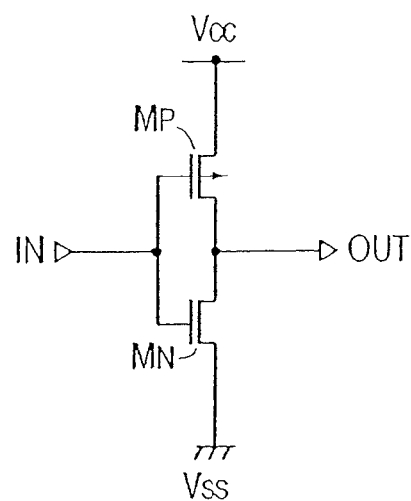
FIG. 22A is a circuit diagram of the conventional CMOS inverter.
Figure 22B:
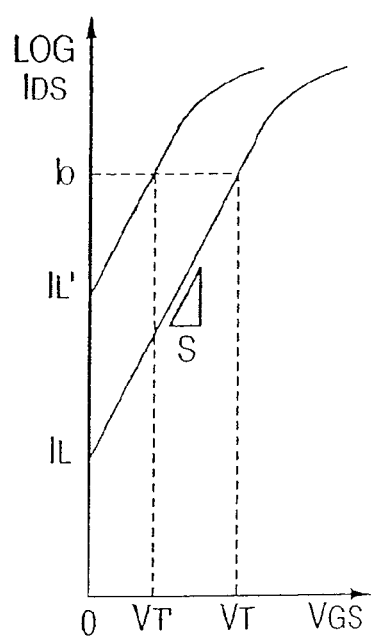
FIG. 22B is a graph showing the subthreshold characteristic of the transistor.
Figure 23:
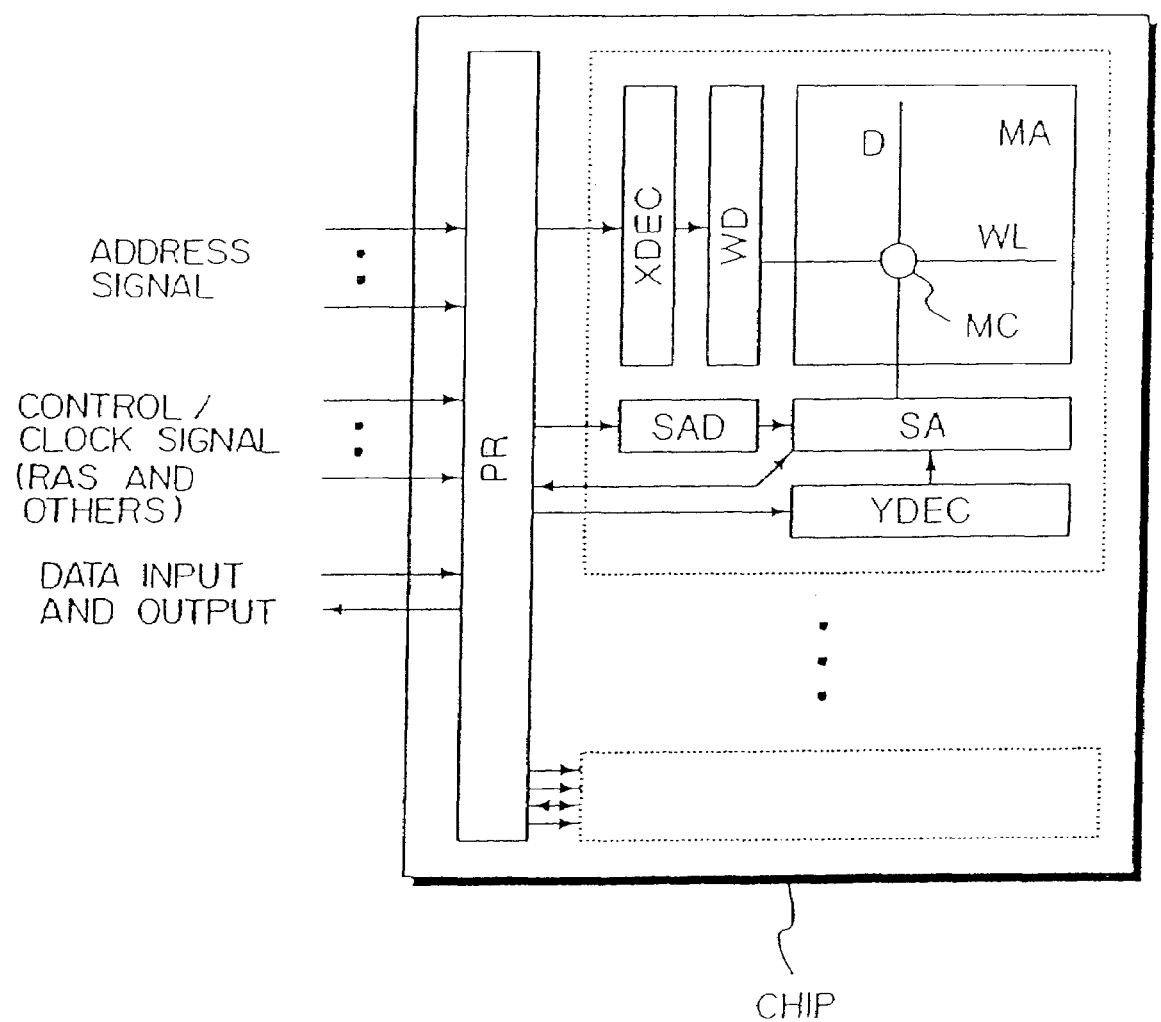
FIG. 23 is a block diagram of a memory.
Figure 24:
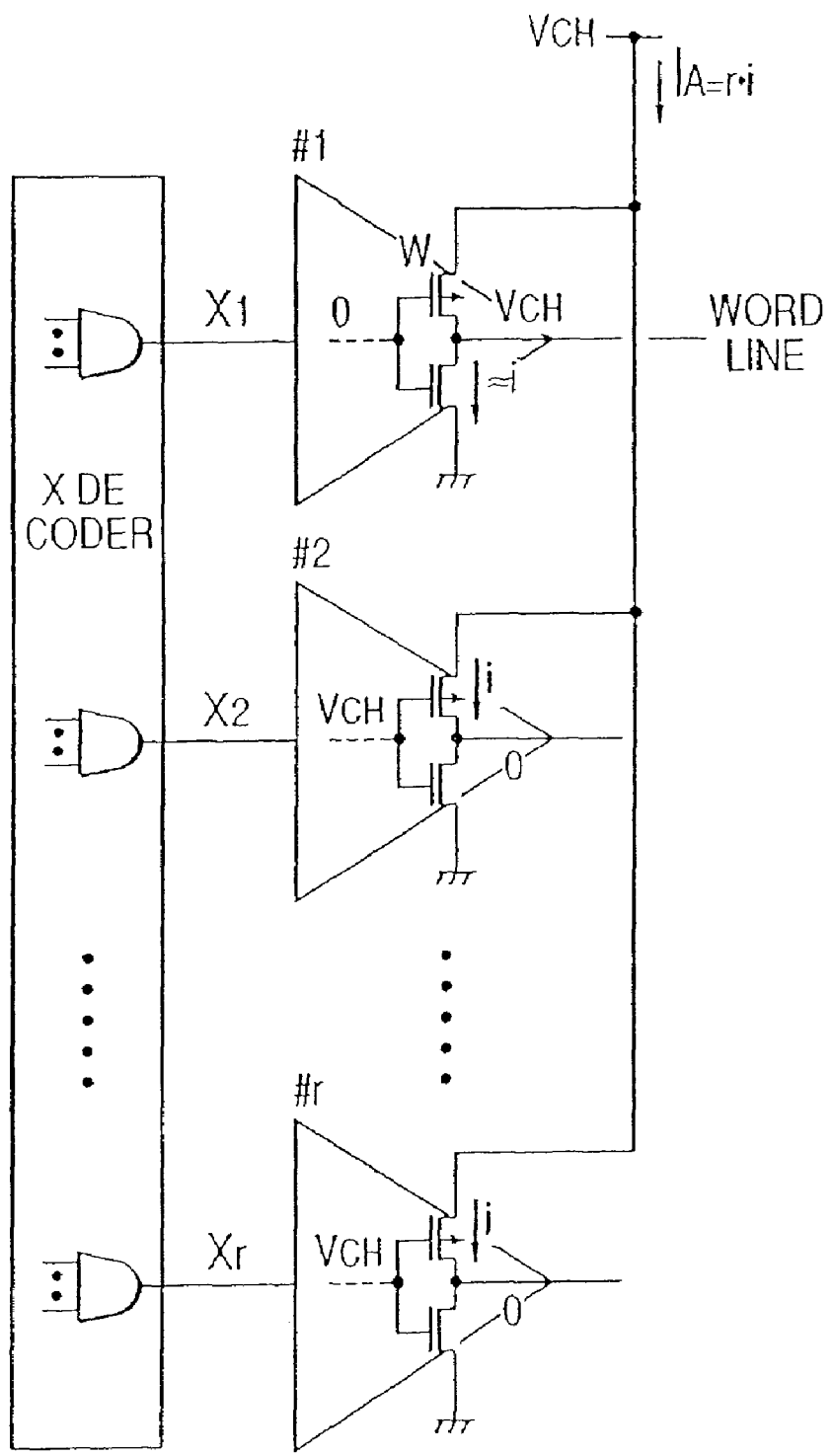
FIG. 24 shows a conventional method of supplying current to word drivers.
Figure 25:
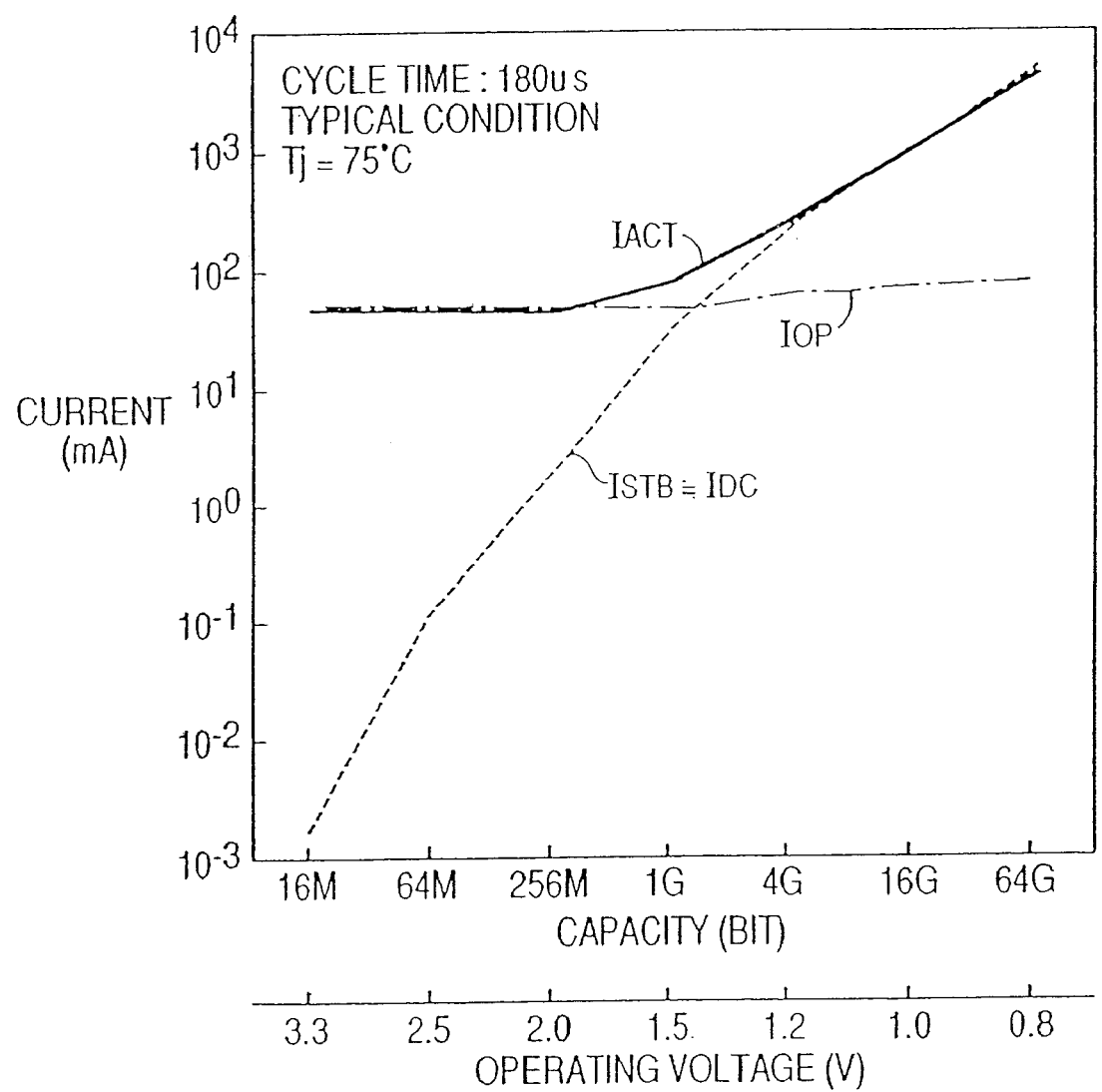
FIG. 25 is a graph showing the prediction of current dissipation in DRAM by the prior art.

First, a description will be made of an application of the invention to a word driver (WD shown in FIG. 23) of DRAM. We consider the state after a word line has been selected and supplied with a necessary word voltage $V_{CH}$. In the conventional arrangement shown in FIG. 24, if $V_T$ is only high enough, almost no subthreshold current flows in the source-drain paths of the MOS transistors of all CMOS drivers of which the gate-source voltages are substantially zero. However, when $V_T$ is reduced to about 0.4 V or below, the subthreshold current flows in the word drivers. As, the capacity becomes large and the word driver number (r) increases, the intensity of this current becomes significant. The total subthreshold current $I_A$ can be expressed as $$I_A = m \cdot n \cdot i = m \cdot n \cdot I_0 \cdot \frac{W}{W_0} \cdot 10^{-\frac{V_T}{S}}$$

where $V_T$ is the threshold voltage defined by the current value $I_0$, and S is the subthreshold swing as shown in FIG. 22B. The word driver source $V_{CH}$ is normally produced by boosting the external source voltage within the chip, and thus its current driving ability is limited. Therefore, the increase of $I_A$ cannot be treated.

There are three methods for the counter-measure: (1) a necessary voltage is applied to the power line to the word driver for a desired period of time, (2) the word driver group is divided into a large number of blocks each of which is formed of a plurality of drivers, and a necessary voltage is applied only to a particular block which is desired to select, and (3) both methods given above are combined.

Figure 1:
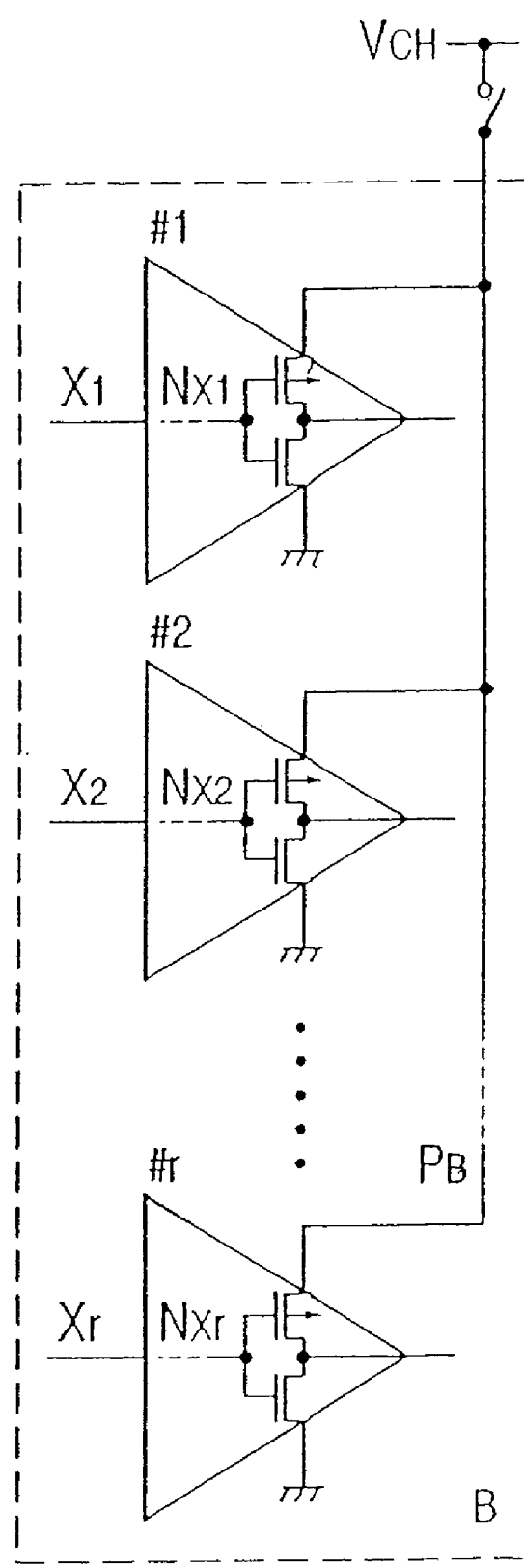
FIG. 1 is a diagram showing an arrangement for limiting the time in which the subthreshold current flows.
Figure 2:
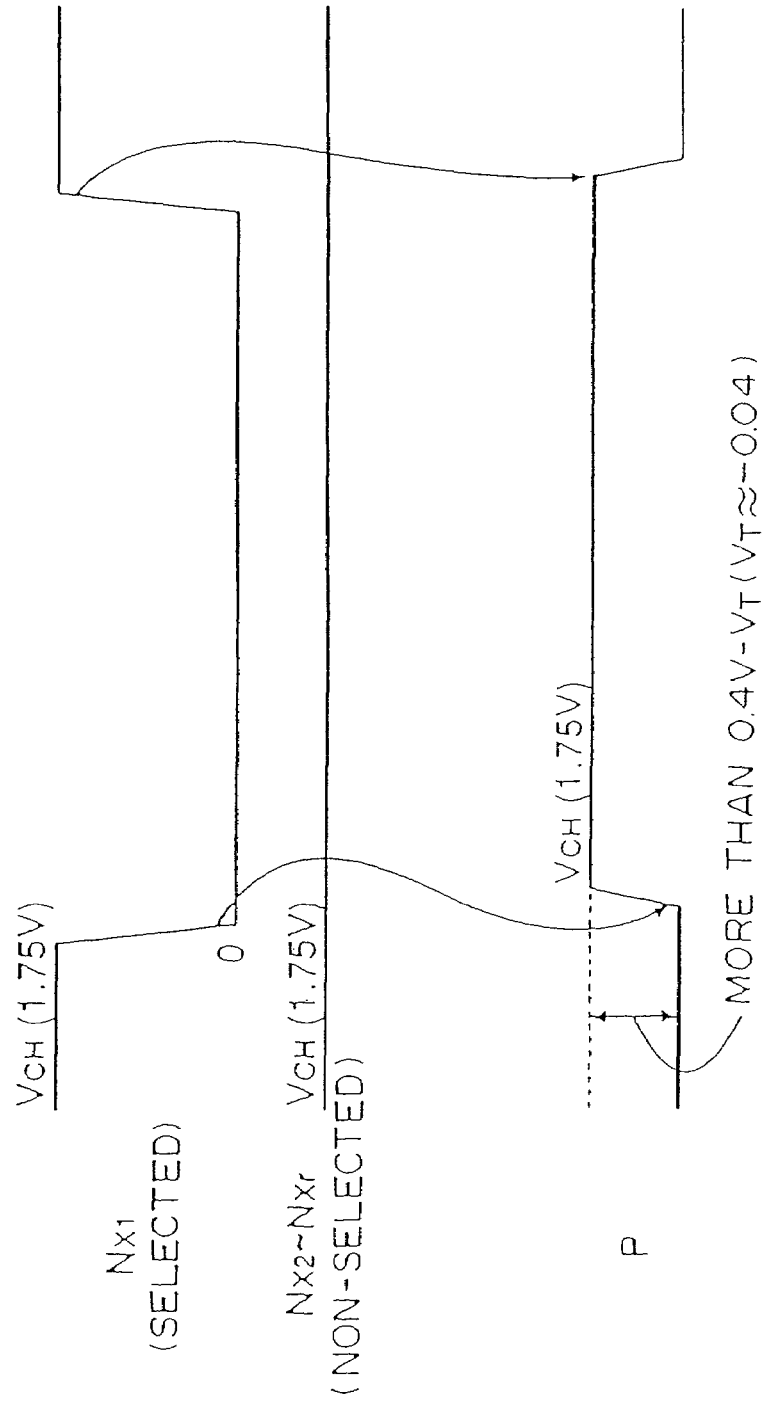
FIG. 2 is a timing chart for controlling the arrangement shown in FIG. 1.

FIG. 1 shows an example of the method in which a necessary voltage is applied to the power line to a word driver for a desired period of time, thereby limiting the time in which the subthreshold current flows. This method has the feature that a desired word voltage is applied to a common power line of a block after the logical input to the driver has been fixed. The operation of the PMOS transistor constituting the word driver will be mentioned with reference to the timing chart of FIG. 2. In the known memory cells for DRAM which are formed of NMOS transistors and capacitors, the voltage of all nonselected word lines must be $V_{ss}$ (0 V), and hence the PMOS transistors within all word drivers including word drivers to be selected have the gate voltage $V_{CH}$. Then, when selecting operation begins, only the gate $N_{x1}$ of the PMOS transistor of the selected driver #1 becomes 0 V. At this time, the other drivers #2 through #r remain at $V_{CH}$. Thus, the gate voltage is fixed for the PMOS transistors of all the word drivers. Before the gate voltage of the PMOS transistors is fixed, the voltage on the common power line $P_B$ which is connected with the sources of the PMOS transistors is set at a certain lower voltage than $V_{CH}$, or in an extreme case, at 0 V in order that the subthreshold current in the PMOS transistors can be neglected. Here, the certain voltage given above is so selected as to be about $V_{CH}$-(0.4 V-$V_T$) as compared with $V_T$ for the PMOS transistor. This is because the effective gate voltage resulting from the subtraction of $V_T$ from the gate-source voltage is, as describe above, necessary to be about 0.4 V in order to make the subthreshold current of the PMOS transistor negligibly small. For example, in a 16-gigabit DRAM, since $V_{CH}$=1.75 V and $V_T$=-0.04 V as described above, here the certain voltage is about 1.31 V. When the common power line $P_B$ is increased to $V_{CH}$ after the gate voltage is fixed, the voltage $V_{CH}$ is applied from the corresponding PMOS transistor to the selected word line. When the gate voltages of the PMOS transistors in all the word drivers are set to $V_{CH}$ after the voltage application for a desired period of time, the selected word line discharges to 0 V through the corresponding PMOS transistor. Then, the voltage on the common power line $P_B$ is again reduced to the certain voltage or below as mentioned above. In the period of time in which the common driving line is separated from $V_{CH}$ by this driving method, there is no subthreshold current. However, during the time in which the voltage $V_{CH}$ is applied to the common driving line, the subthreshold current still flows in the PMOS transistors of the nonselected word drivers. When any word driver is operated, $V_{CH}$ must be applied to the common driving line, and hence the subthreshold current cannot be reduced.

Even when the logic input to the driver is fixed after a necessary word voltage is applied to the common power line, a correct voltage can be produced on the word line. In this case, during the period of time in which the logic input to the driver is fixed after the word voltage is applied to the power line, the subthreshold current wastefully flows in all the word drivers. On the other hand, in the method of applying a word voltage to the common power line after the logic input is fixed, the waste current during this period can be reduced. However, the operation speed is lowered. Since the parasitic capacitance of the common power line is large, the rise time on this line becomes long and thus the access time increases the more.

Figure 3:
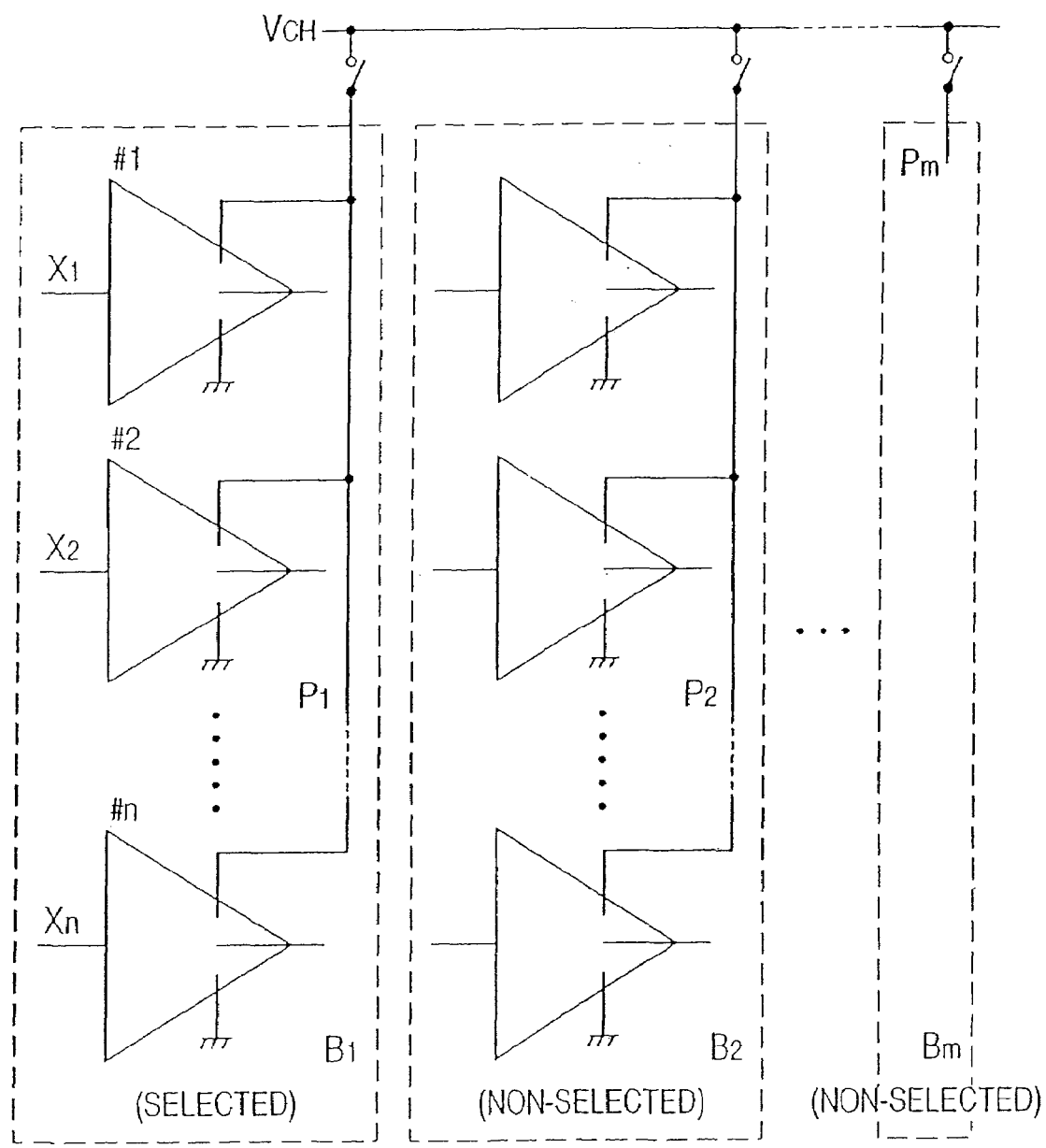
FIG. 3 shows an embodiment of a one-dimensional arrangement of blocks.
Figure 4:
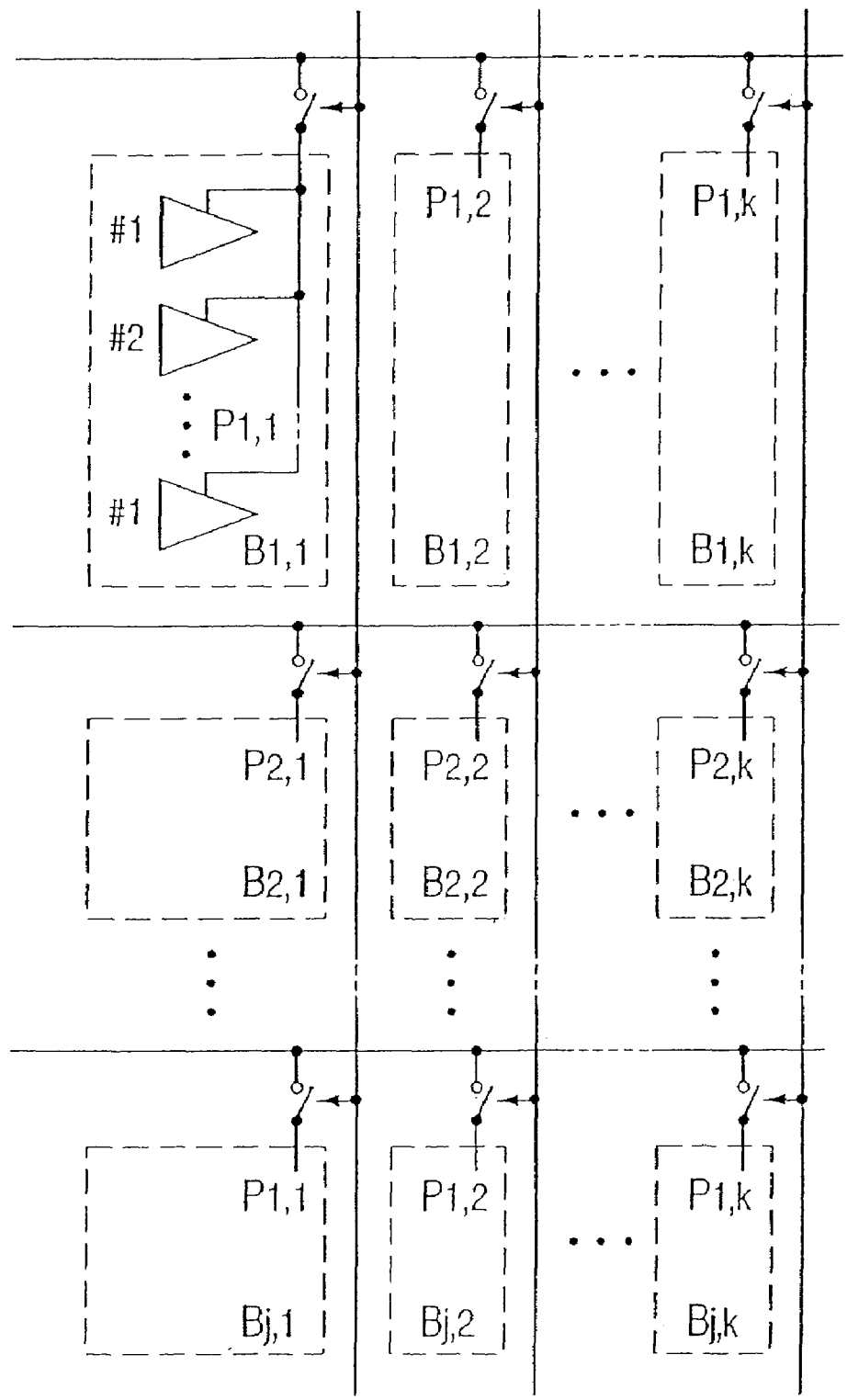
FIG. 4 shows an embodiment of a two-dimensional arrangement of blocks.

FIG. 3 and FIG. 4 show conceptional embodiments for solving the above problems. These embodiments have the feature that the word driver group is divided into a large number of blocks each of which is formed of a plurality of drivers, and that the subthreshold current is caused to flow only in a selected block. In other words, the subthreshold current upon operation can be reduced in inverse proportion to the block number. FIG. 3 shows a one-dimensional arrangement of m blocks of n word drivers each (where m·n=r). In this embodiment, the subthreshold current can be reduced by m-fold that in the embodiment shown in FIG. 1. FIG. 4 shows a two-dimensional arrangement (matrix) of k blocks (k is not Boltzmann constant) of l word drivers each in the row direction and j blocks of l word drivers each in the column direction (where j·k·l=r). In this arrangement, the subthreshold current can be reduced by 1/(j·k) that in the embodiment shown in FIG. 1. Some embodiments concerning the one-dimensional arrangement and two-dimensional arrangement will be described in detail.

Figure 5A:
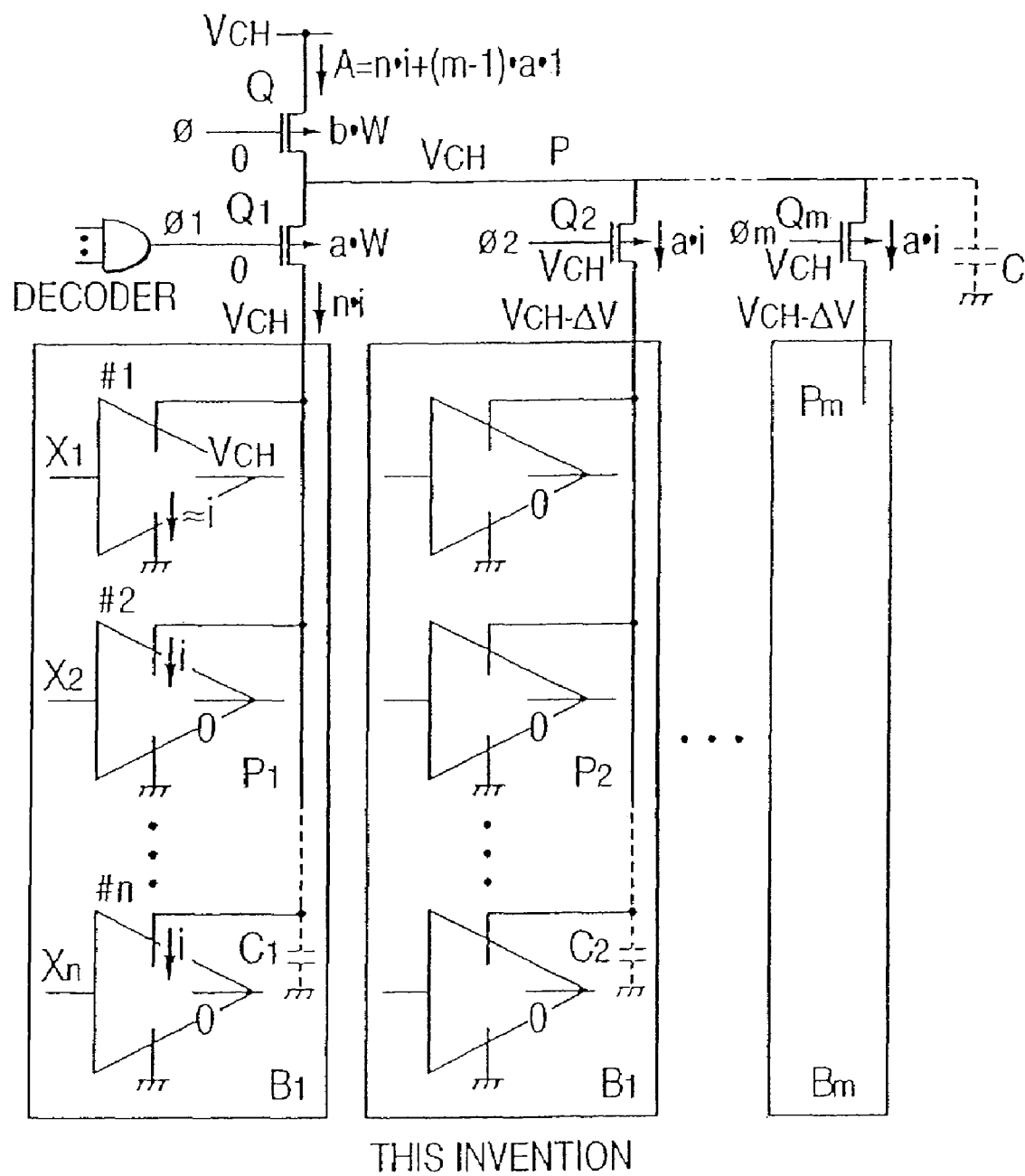
FIG. 5A shows an embodiment of a one-dimensional arrangement of word driver blocks.
Figure 5B:
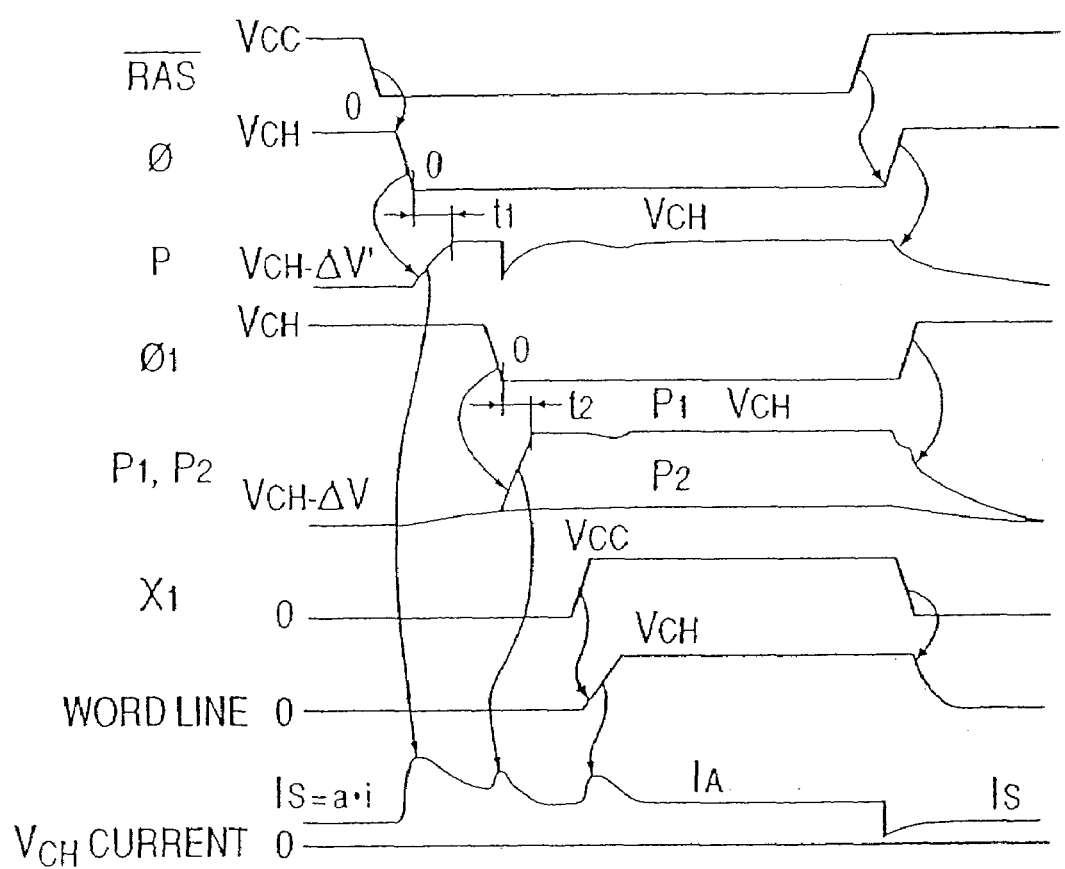
FIG. 5B is a timing chart for the operation of the embodiment shown in FIG. 5A.

A specific embodiment of the one-dimensional arrangement will be first described in detail. FIG. 5A shows an embodiment of the one-dimensional arrangement of word driver blocks, and FIG. 5B is a timing chart for the operation of this embodiment. In this embodiment, a second power line is provided common to the power lines to the blocks so as to be hierarchical. This hierarchical type power line system has the following two features.

(1) Hierarchical type power lines to driver blocks: m blocks of n word drivers #1 through #n each are provided, power lines $P_1$ through $P_m$ to the blocks are respectively connected through block selection transistors $Q_1$ through $Q_m$ to a common power line P, and the line P is connected to a power line of word voltage $V_{CH}$ through a transistor Q for selecting one of the operating mode and the standby mode.

(2) Setting of hierarchical gate width: the gate width (a·w) of the block selection transistors $Q_1$ through $Q_m$ is previously selected to be much smaller than the sum (n·W) of gate widths of the word driver transistors within one block (a<n), and the gate width (b·W) of the transistor Q is previously selected to be much smaller than the sum (m·a·W) of the gate widths of the selected transistors of all blocks (b<m·a).

Upon operation, the transistors Q and Q1 are turned on, permitting the voltage $V_{CH}$ to be applied to the power line P1 for the block B1 including the selected word driver #1. Here, the voltages $V_T$ of all the transistors are assumed to be equal and a low value. According to this arrangement, the subthreshold current of each of the nonselected blocks $B_2$ through $B_m$ is smaller than that of the corresponding block selection transistor $Q_2$ through $Q_m$ because the subthreshold current is proportional to the gate width of the transistor. Even if a current of n·i tends to flow, all the subthreshold currents are limited by the subthreshold current (a·i) of the block selection transistor. At that time, the voltages on the power lines $P_2$ through $P_m$ to the nonselected blocks still remain reduced by Δ V substantially as in the standby mode because the subthreshold currents of the transistors $Q_2$ through $Q_m$ for charging the lines $P_2$ through $P_m$ are relatively small. Therefore, the total subthreshold current $I_A$ is calculated from Table 1 to be substantially (n+m·a)i when m <1. If a is selected to be about 4, it is possible to reduce the effect on the operating speed of the series transistors Q, $Q_1$ and the chip area.

TABLE 1

| | Operating current ($I_A$) | Standby current ($I_S$) | Necessary $t_1$ | Charge $t_2$ |
|---|---|---|---|---|
| Prior Art | m · n · i | m · n · i | 0 | 0 |
| This invention | n · i + (m − 1) · a · i | b · i | C · ΔV' | $C_1$ · ΔV |

If the word driver number (m·n) is constant, the subthreshold current n·i of the selected block is inversely proportional to the total subthreshold current m·a·i of the nonselected blocks. Thus, in order to reduce $I_A$, it is desired that the subthreshold current n·i of the selected block be substantially equal to the total subthreshold current m·a·i of the nonselected blocks, or n≈m·a. If this condition is not satisfied, $I_A$ will be increased by the amount corresponding to the deviation from the condition. The number, m of blocks to be fixed depends on the decoder for the block selection signal and the layout area. It is desirable to make $I_A$ less than about five times the minimum value. To meet this requirement, a larger one of the subthreshold current of the selected block and the total subthreshold current of the nonselected blocks should be within 10 times the value which minimizes $I_A$. In other words, it is necessary that the ratio between the subthreshold current of the selected block and the total subthreshold current of the nonselected blocks be within the range from 0.01 to 100.

Figure 7:
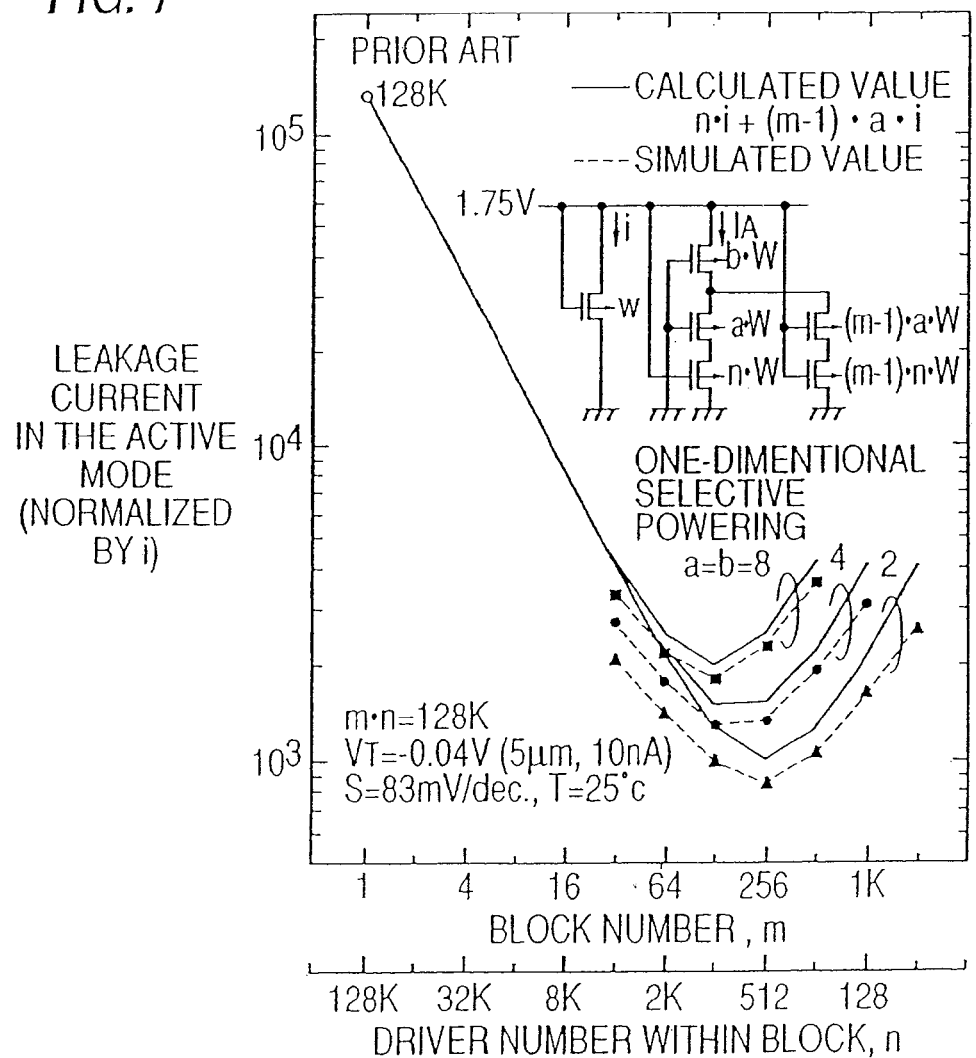
FIG. 7 is a graph showing the block-number dependency of the leakage current for one-dimensional selection.

FIG. 7 shows the active-mode subthreshold current $I_A$ with respect to the block number when the word driver number (m·n) is 128K. In this graph, the interconnection resistance and interconnection capacitance are neglected. The calculated curve and the simulated curve exhibit the same tendency and have the minimum value when m and n are selected to satisfy n≈m·a. Taking a=b=4 as an example, the leakage current becomes the minimum, or less than ⅛₅ the value in the prior art when the block number m is selected to be 128 or 256. The tendency that the simulated curve takes lower values than the calculated value will be probably caused by the effect of the on-resistance of the PMOS transistor used as a switch.

Figure 6:
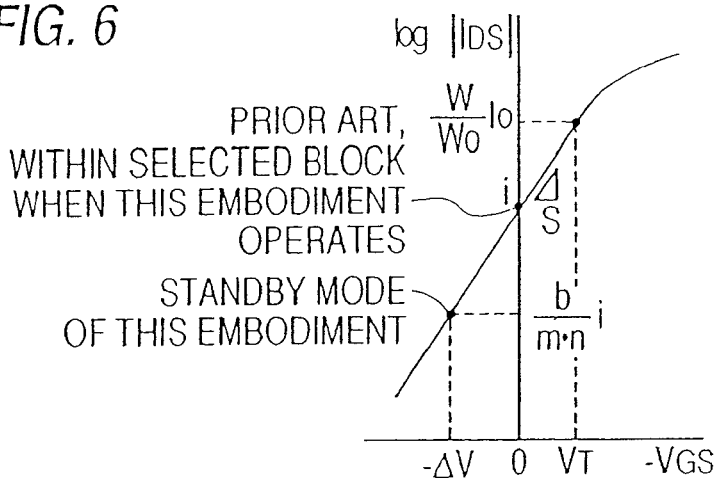
FIG. 6 is a graph showing the operating point of the p-channel MOS transistor of the word driver in the embodiment shown in FIG. 5A.

In the standby mode, all the transistors Q, $Q_1$ through $Q_m$ are almost turned off. The total subthreshold current $I_s$ becomes equal to the subthreshold current of the transistor Q, and can be reduced by a/m·n as compared with the prior art. The voltage on the power line to the blocks is reduced from $V_{CH}$ by Δ V which is determined by the ratio between m·n·W and a·W and the subthreshold swing. At this time, the operating point of the p-channel MOS transistor of the word driver is as shown in FIG. 6.

When the transistor Q is not used, or when the switch shown in FIG. 3 is replaced by the transistor of gate width a·W, the total subthreshold current m·a·i flows in in PMOS transistors of gate width a·W in the standby mode. Since the gate width ratio a cannot be reduced even under the divided blocks because of the driving ability of the selecting circuit in the active state, the standby current is increased with the increase of the block number m. When the word driver number (m·n) is constant, n cannot be decreased unless m is increased, and hence the n·i part of the subthreshold current in the operating mode cannot be decreased. Therefore, the subthreshold currents in both the standby mode and the operating mode cannot be simultaneously minimized.

In this embodiment, this problem is solved by inserting the transistor Q and setting the gate width at b<m·a so as to make a double-stage current limiting function. In other words, a transistor of gate width b·W is provided common to m transistors of gate width a·W so that the current limiting function has two stages. Thus, the subthreshold current in the operating mode remains n·i+(m−1)·a·i, while the subthreshold current in the standby mode can be reduced to b·i. Since the subthreshold current in the standby mode is not dependent on m and n, m and n can be combined to minimize the subthreshold current in the operation mode, or n≈m·a can be established.

The operation will be described with reference to the timing chart of FIG. 5B. In the standby mode ($\Phi$, $\Phi_1$ through $\Phi_m$: $V_{CH}$), the transistors Q and $Q_1$ through $Q_m$ are almost turned off. Therefore, the power line P is at a lower voltage $V_{CH}-\Delta V'$ than $V_{CH}$, and the power lines $P_1$ through $P_m$ are at a further lower voltage $V_{CH}-\Delta V$ than that. All the word lines are fixed at $V_{ss}$ independently of the voltage of the power lines $P_1$ through $P_m$. When the external clock signal/RAS (where "/" indicates a complementary signal) is turned on, the transistor Q is turned on at $\Phi$, permitting the parasitic capacitance C of the line P to be charged for time $t_1$ to reach $V_{CH}$. Then, the transistor $Q_1$ is turned on at $\Phi_1$, permitting the parasitic capacitance $C_1$ of the line $P_1$ to be charged for time $t_2$ to reach $V_{CH}$. At this time, the transistors $Q_2$ through $Q_m$ are still substantially in the off-state. Then, the word driver #1 is selected by the X decoder output signal $X_1$, and drives the word line. When the clock signal /RAS is turned off, the transistors Q and $Q_1$ are turned off. After lapse of a long time, the power lines P and $P_1$ are respectively reduced to $V_{CH}-\Delta V'$ and $V_{CH}-\Delta V$ by the mechanism mentioned above. Here, the power lines (P, $P_1$) can be charged to $V_{CH}$ without reducing the access time because $\Delta V'$ is as small as several hundred mV even if the parasitic capacitance C is large and because the charging time $t_1$ for the line P can be maintained to be long enough immediately after the clock signal /RAS is turned on. In addition, because of the block arrangement, the parasitic capacitance $C_1$ is relatively small and thus the charging time $t_2$ for the line $P_1$ can be reduced.

If the hierarchical type power lines are provided for the decoders, the subthreshold current can be greatly reduced.

Figure 8:
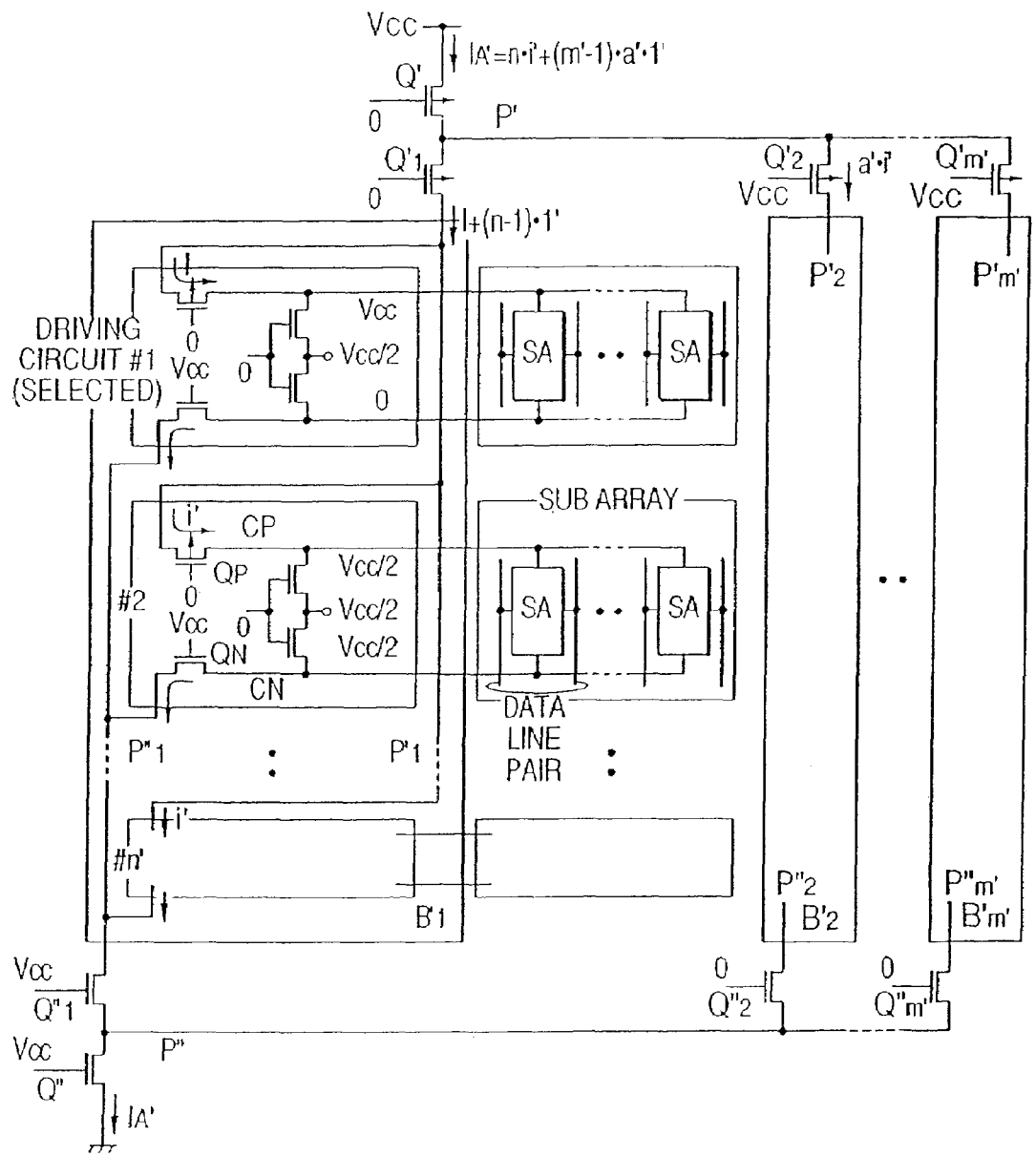
FIG. 8 shows an embodiment of a one-dimensional arrangement of sense amplifier driving circuit blocks.
Figure 9:
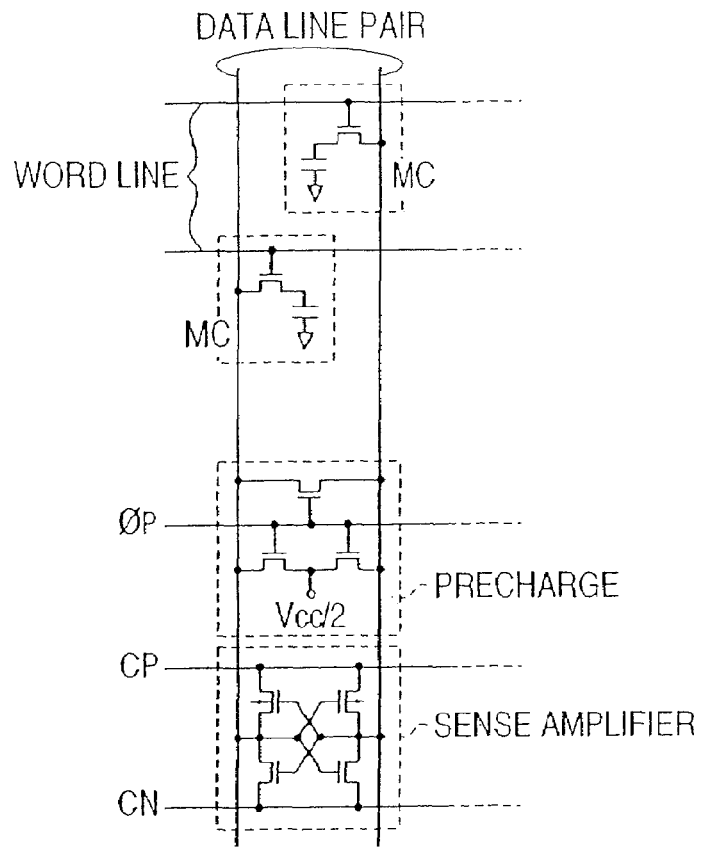
FIG. 9 shows an example of the arrangement of a main part of the memory array.

FIG. 8 shows a hierarchical power line scheme applied to a sense amplifier driving circuit (SAD in FIG. 23), and FIG. 9 shows a main part of a memory array of memory cells each of which is formed of a single transistor and a single capacitor. Since the well-known $V_{cc}/2$ precharge scheme is used, this sense amplifier driving circuit operates based on the central value, Vcc/2. Thus, it has the feature that the hierarchical type power lines are used for both $V_{cc}$ and $V_{ss}$. Here, it is assumed that the conductance of the PMOS transistor $Q_P$ is equal to that of the NMOS transistor $Q_N$. The CMOS sense amplifier (SA) group within the sub-array is selectively driven by the corresponding sense amplifier driving circuit. At this time, the current $I_A'$ flowing through the power lines $V_{cc}$, $V_{ss}$ is governed by the subthreshold currents of a large number of nonselected driving circuits. Even if the gates of the transistors $Q_P$, $Q_N$ shown in FIG. 8 are respectively applied with $V_{cc}$ and 0 not to be selected, the sense amplifier driving lines CP, CN are at $V_{cc}/2$, and thus the subthreshold current flows from $P'_1$ to $P'''_1$. In order to prevent this, it is absolutely necessary to apply the hierarchical power-line scheme to both sides. If the hierarchical type power lines are applied to only $V_{cc}$, the subthreshold current of the transistor $Q_N$ flows from $V_{cc}/2$ to $P'''_1$, thus reducing the level of $V_{cc}/2$ because the current driving ability of the $V_{cc}/2$ supply circuit built in the chip is small.

Figure 10:
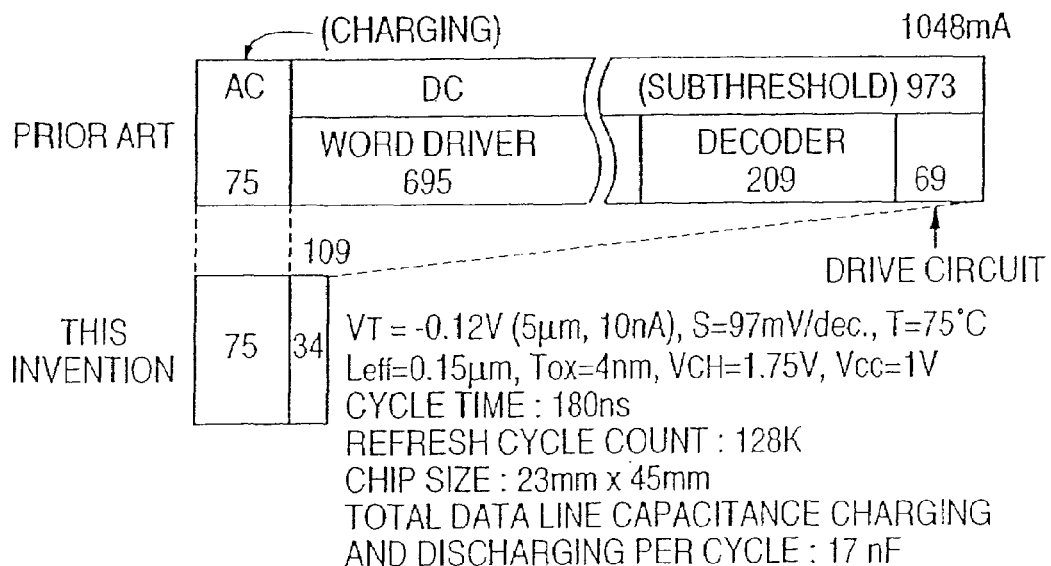
FIG. 10 shows the effect of the invention.

FIG. 10 shows the active current reducing effect of the invention applied to the word drivers, decoders and sense amplifier driving circuit with the subthreshold current being assumed not to flow in the peripheral circuit (PR in FIG. 23) portion. A 16 gigabit DRAM is given as an example. The parameters used are as follows. The threshold voltage $V_T$ which is defined by a voltage at which a current of 10 nA flows in a gate width 5 μm is −0.12V, the subthreshold swing S is 97 mV/dec, the junction temperature T is 75° C., the effective gate length $L_{eff}$ is 0.15 μm, and the gate oxide film thickness $T_{OX}$ is 4 nm. In addition, the word voltage $V_{CH}$ is 1.75 V, the source voltage $V_{cc}$ is 1 V, the cycling time is 180 ns, the refresh cycle number is 128 k, the chip size is 23 mm×45 mm, and the total capacitance of data lines which charge and discharge in one cycle is 17 nF. According to this invention, the active current can be reduced from about 1.05 A to about 1/10 that value in the prior art, or to 109 mA. This is because the subthreshold current can be greatly reduced from about 0.97 A to about 1/30 that value in the prior art, or to 34 mA.

The embodiments of the invention have been described in which the word drivers and sense amplifier driving circuit are provided in the one-dimensional arrangement of blocks. This invention is not limited to the above embodiments, but may take various modifications as given below.

Figure 11:
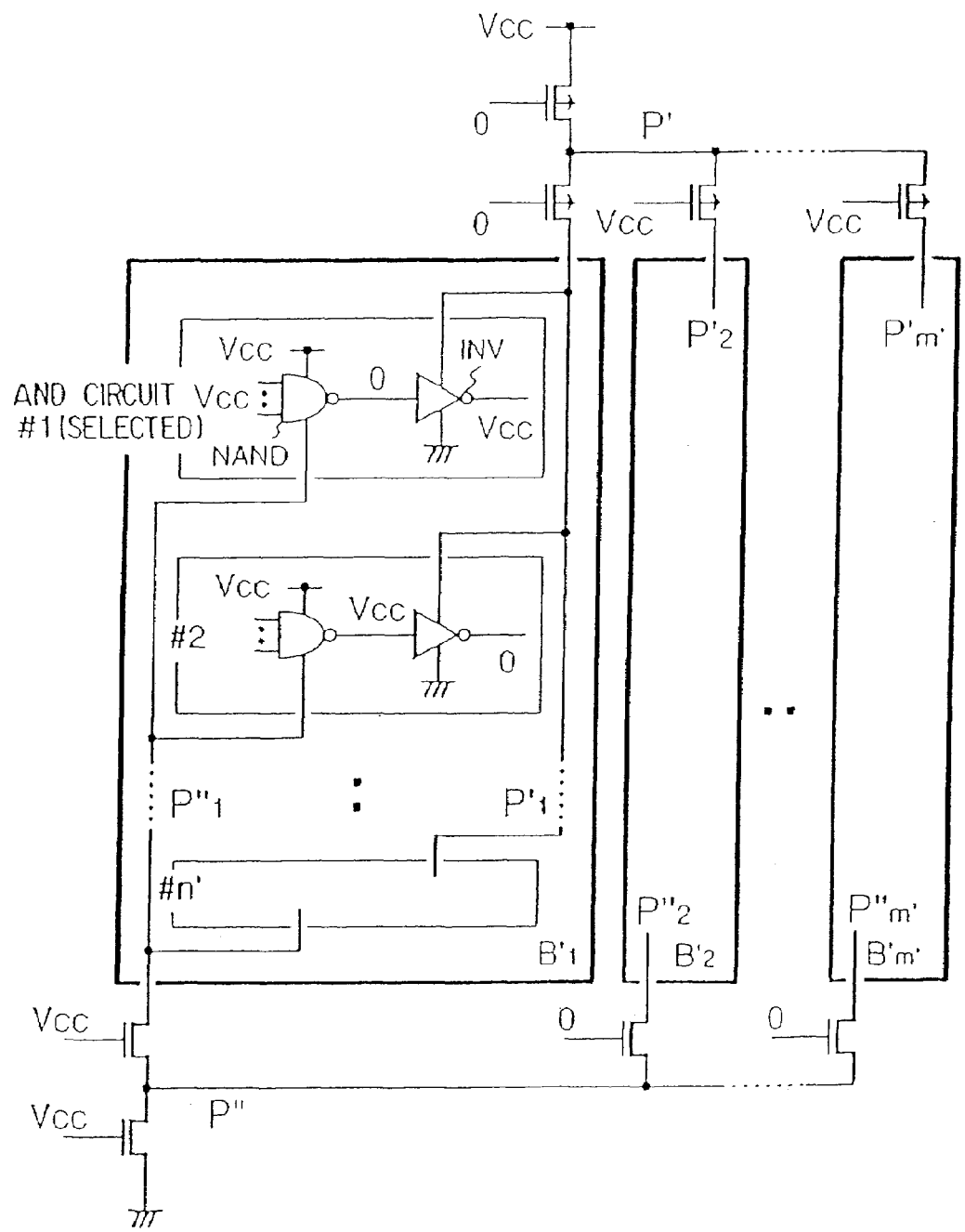
FIG. 11 shows an embodiment of a one-dimensional arrangement of decoder blocks.

FIG. 11 shows an example of the hierarchical type power-line scheme applied to the decoder. This arrangement shown in FIG. 1 has AND circuits each of which is formed of two stages, or a NAND circuit and an inverter of a CMOS logic circuit. As illustrated in FIG. 11, the feature is that the hierarchical power lines are provided on both sides of $V_{cc}$ and $V_{ss}$, though the operating point is not $V_{cc}/2$ unlike the sense amplifier driving circuit. In the standby mode, all the NAND circuits produce $V_{cc}$, and in the operating mode, a small number of ones of the NAND circuits produce 0 V. Since the subthreshold current is determined by the n-channel MOS transistor on $V_{ss}$ side, the hierarchical power lines are on the $V_{ss}$ side. On the contrary, all the inverters produce 0 V in the standby mode, and a small number of ones of the inverters produce $V_{cc}$ in the operating mode. Since the subthreshold current is determined by the p-channel MOS transistor, the hierarchical power lines are used on the $V_{cc}$ side.

This invention can be applied to the circuit group which produces the same voltage in the standby mode, and a small number of circuits of which operate in the operating mode. At this time, all the circuits are of the same transistor size, but may be different in their construction.

Figure 12:
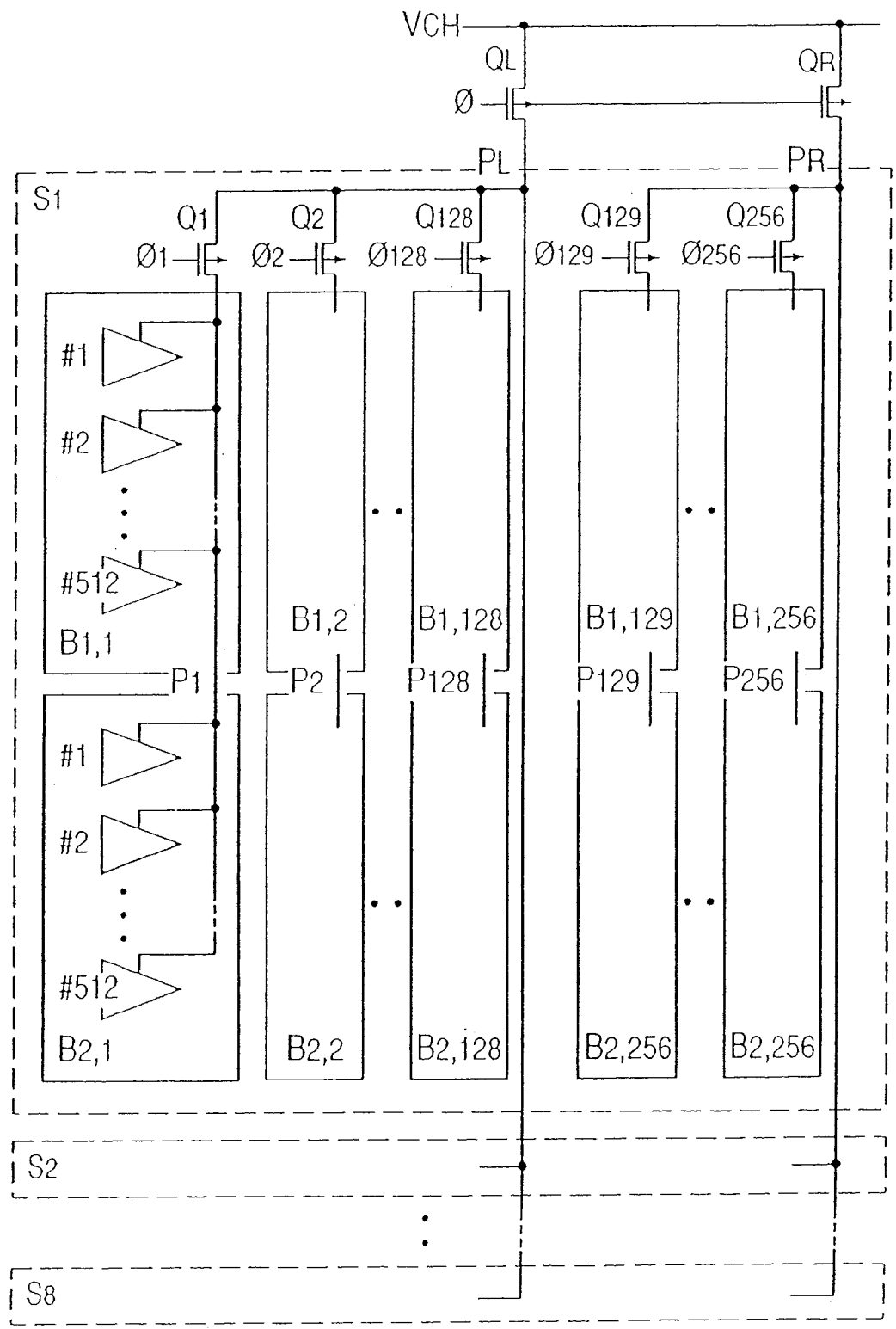
FIG. 12 shows another embodiment of a one-dimensional arrangement of word driver blocks.

FIG. 12 shows another embodiment of the application of the invention to the word driver. In the embodiment shown in FIG. 12, 16 ones of 2M word drivers are simultaneously operated. This embodiment is different from the embodiment shown in FIG. 5A in that a plurality of power lines are used. As illustrated in FIG. 12, each block is formed of 512 word drivers, and 8 sectors $S_1$ through $S_8$ are provided each of which is formed of 512 blocks ($B_{1,1}$ through $B_{1,256}$, $B_{2,1}$ through $B_{2,256}$). Two blocks (for example, $B_{1,1}$ and $B_{2,1}$) of each sector share one power line (for example, $P_1$). The first 128 ones of the power lines $P_1$ through $P_{256}$ are connected through block selection transistors $Q_1$ through $Q_{128}$ to a power line $P_L$, and the other 128 ones are connected through block selection transistors $Q_{129}$ through $Q_{256}$ to a power line $P_R$. These power lines $P_L$ and $P_R$ are common to the 8 sectors. The power lines $P_L$ and $P_R$ are further connected through transistors $Q_L$ and $Q_R$ to the power line $V_{CH}$. The gate width of the transistors $Q_1$ through $Q_{256}$ is selected to be much smaller than the total gate width of the transistors of the word drivers of two blocks, or $1\times10^3$ word drivers. In addition, the gate width of transistors $Q_L$, $Q_R$ is selected to be much smaller than the total gate width of the block selection transistors connected to each of the power lines $P_L$, $P_R$, or 8×128 block selection transistors. In the operating mode, the eight sectors make the same operation. For example, the transistors $Q_L$, $Q_R$ and the transistor $Q_1$ within each sector are turned on and $V_{CH}$ is applied to the two blocks ($B_{1,1}$ and $B_{2,1}$) including the selected word driver #1. The subthreshold current is the same as when m and n are respectively selected to be 256 and $4\times10^3$ in the embodiment shown in FIG. 5. Thus, when a plurality of circuits are simultaneously operated, a plurality of blocks are selected at a time. If the transistors as switches are divided into a plurality of groups and connected, the power lines can be shortened so that the interconnection resistance can be reduced. Thus, the power line $P_1$ to the selected block can be charged in a short time.

Figure 13:
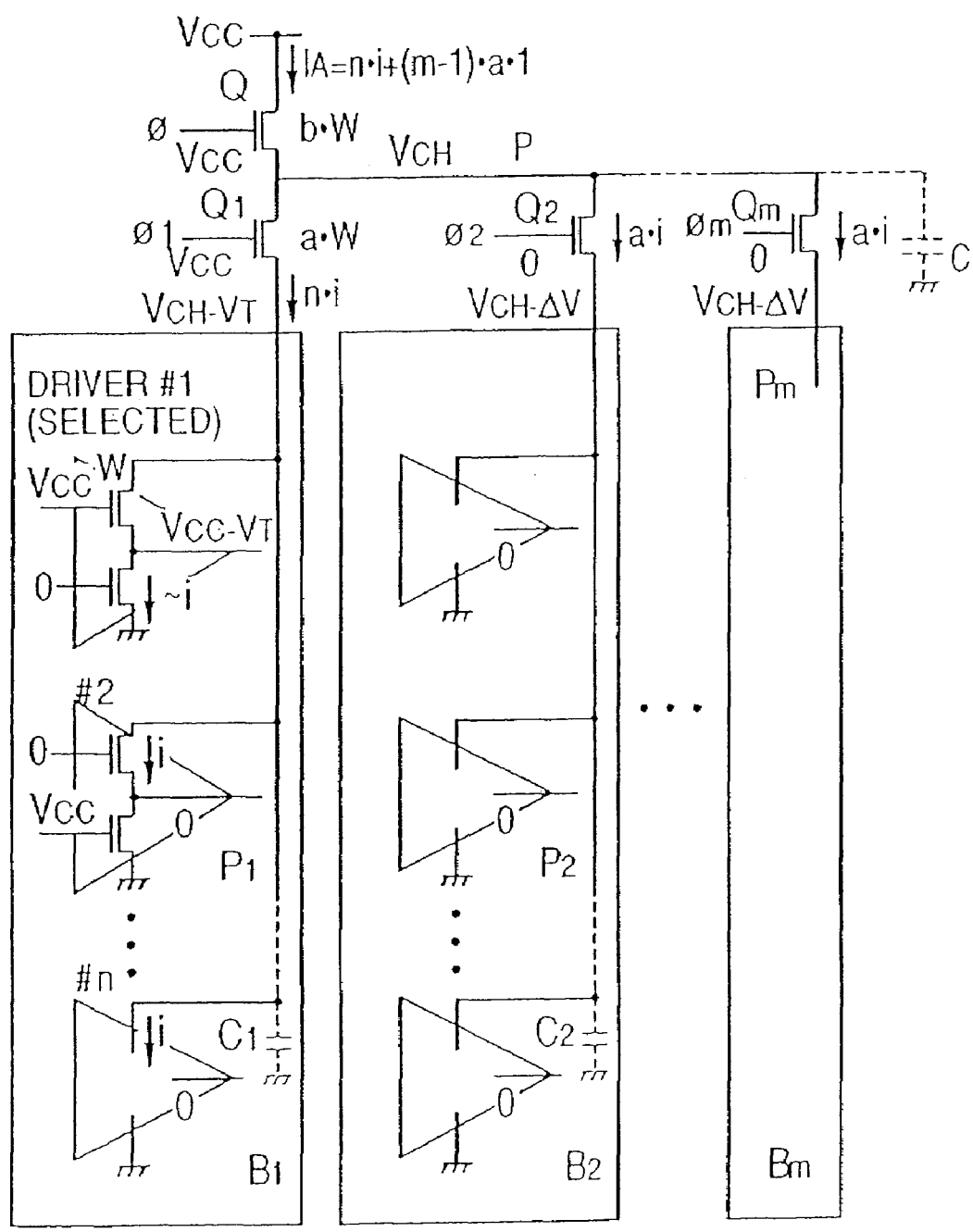
FIG. 13 shows an embodiment of a one-dimensional arrangement of n-channel MOS driver blocks.

FIG. 13 shows an example of the application of the invention to n-channel MOS drivers. This embodiment has the feature that the hierarchical type power lines are connected to the drains of the transistors. Each driver is a push-pull circuit configuration of two n-channel MOS transistors. The nonselected drivers produce 0 V, and the selected driver produces $V_{cc}$-$V_T$. The hierarchical type power lines are provided on the drain, or $V_{cc}$ side of the transistors. Thus, the subthreshold current can be reduced without changing the outputs of the nonselected drivers as in the embodiment shown in FIG. 5. In FIG. 13, if the block selection transistors $Q_2$ through $Q_m$ are in the off state, the voltages on the power lines $P_2$ through $P_m$ are greatly reduced so that no current flows in the word driver transistors even though the subthreshold current is not so affected by the drain voltage. Thus, this invention can be applied to the logic circuit other than the CMOS one.

In either of the above embodiments, it is desired that the substrate of the transistors which has not been mentioned be connected to the power supply. In this case, the amount of charge necessary for charging the power lines becomes smaller and the charging time is shorter, than when the substrate is connected to the power lines which are connected to the drains. For example, in the embodiment shown in FIG. 5, all the substrate of the p-channel MOS transistors is connected to $V_{CH}$, so that when the voltage $V_{CH}$ of the power lines of the nonselected blocks is reduced by ΔV as described above, the threshold voltage of the p-channel MOS transistors within the nonselected blocks is increased by the body effect. The source voltage becomes lower than the gate voltage, and in addition since the threshold voltage is increased, the same current reducing effect can be achieved by a small ΔV as compared with the case in which the substrate is at the same voltage as the drain.

In the above embodiments, the threshold voltages of the transistors are all equal. If the threshold voltage of the transistors used as switches is made higher than the other transistors, the subthreshold current can be further reduced. If the threshold voltage of the transistors Q and $Q_1$ through $Q_m$ shown in FIG. 5 is made higher than that of the transistors within the word drivers and if a and b are selected to be large, the operating speed can be prevented from being reduced by the on-resistance of the switches, and the subthreshold current can be further reduced. The subthreshold current is exponentially affected by the threshold voltage of the switches at the off-state, while the on-resistance is only linearly affected. Even if the gate capacitance is increased with the gate width, there is no problem in the operating speed provided that the charging time $t_1$, $t_2$ is assured in FIG. 7. In addition, as to the layout area, the number is relatively small and thus there is no problem. In some case, even if only the transistor Q has a high threshold voltage, the standby current can be effectively reduced.

As shown in the timing chart of FIG. 7, during the active period in which the clock signal /RAS is 0 V, the transistors Q and $Q_1$ are kept on with Φ and $Φ_1$ reduced. This is realized by controlling the Φ by a signal for specifying the operating mode at the active time and standby time which is produced by the clock signal /RAS and by controlling the $Φ_1$ by the combination of that signal and an address signal. In addition, by use of a signal for specifying the period from the trailing edge of the clock /RAS to the end of the word line driving, it is possible to make the Φ and $Φ_1$ $V_{CH}$ and transistors Q and $Q_1$ off after the word line driving. Thus, the subthreshold current after the word line driving can be reduced to the same extent as the standby current $I_s$ even at the active time. This effect is the greater, the longer the active period in which the clock signal /RAS is 0 V. In this case, for rewriting the memory cell, it is necessary to reduce the Φ and $Φ_1$ and turn on the transistors Q and $Q_1$ for a constant period from the leading edge of the clock signal /RAS. Even in the embodiment in which this invention is applied to the decoders shown in for example FIG. 11, the subthreshold current after fixing the output can be further reduced.

Figure 14:
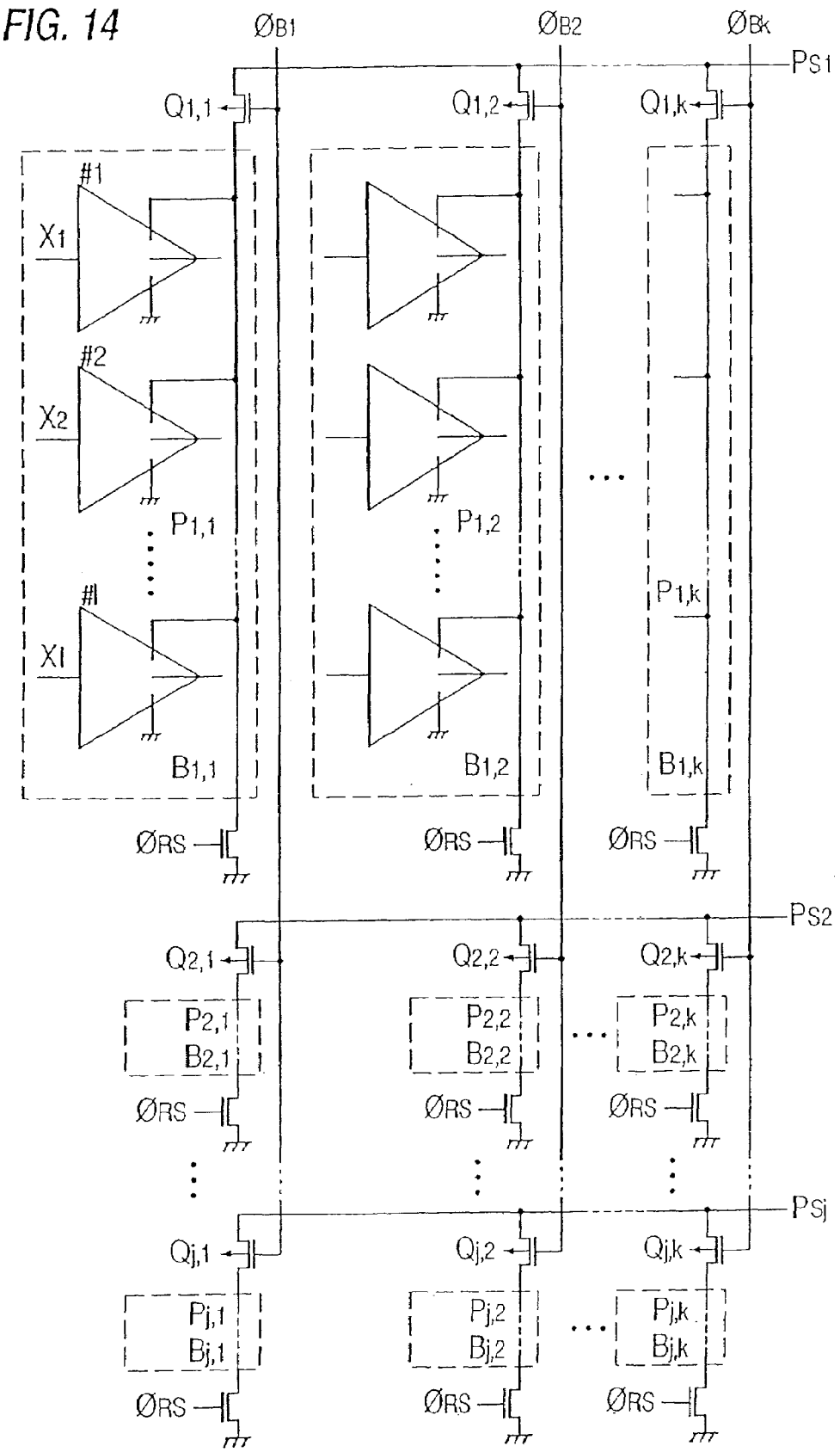
FIG. 14 shows an embodiment of a two-dimensional arrangement of a typical selection system.
Figure 15:
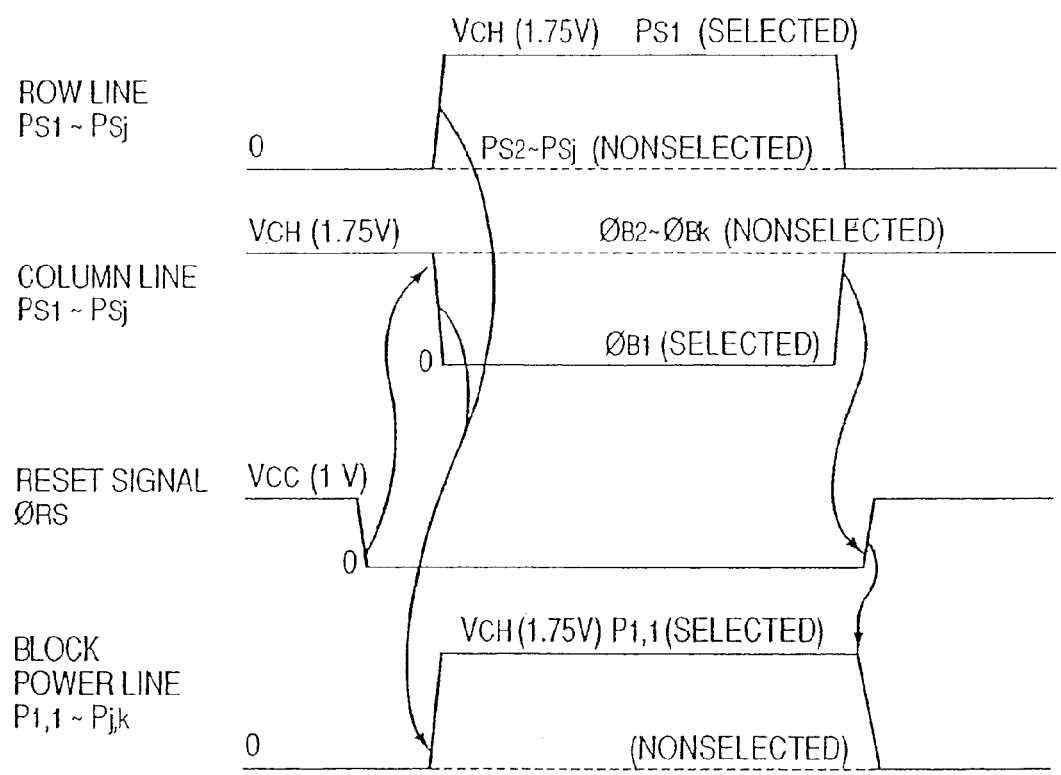
FIG. 15 is a timing chart for controlling the embodiment shown in FIG. 19.

Some embodiments of this invention concerning the two-dimensional arrangement will be described in detail. FIG. 14 shows an embodiment of a typical selection system of the two-dimensional arrangement. FIG. 15 is a timing chart for the operation of this embodiment. A necessary word voltage $V_{CH}$ is applied to a row line ($P_{s1}$) corresponding to, for example, a block $B_{1,1}$ which is desired to select, and 0 V is applied to the corresponding column ($Φ_{B1}$) The block selection p-channel MOS transistor $Q_{1,1}$ is turned on, and the power line $P_{1,1}$ belonging to $B_{1,1}$ is charged to $V_{CH}$. Since the p-channel MOS transistor constituting the word driver belonging to $B_{1,1}$ already has a fixed gate voltage, $V_{CH}$ is applied to the word line selected according to this. Of course, as described above, even if the gate voltage is fixed after the application of $V_{CH}$ to $P_{1,1}$, the word line can be correctly driven. After the voltage is applied for a desired period of time, the power line $P_{1,1}$ is discharged to 0 V through the n-channel MOS transistor connected thereto. The power line belonging to the nonselected blocks remains 0 V. Here, for simplicity, we consider that the $V_T$ of the block selection p-channel MOS transistor and power line discharging n-channel MOS transistor is selected to be high enough (about 0.4 V). Since the power line for the nonselected blocks is always 0 V, no subthreshold current flows in the word drivers of the nonselected blocks. Therefore, the total subthreshold current can be greatly reduced to only the subthreshold current in a single word driver of the selected block. In addition, since the power line is divided into power lines with a small-parasitic capacitance which are driven, higher speed operation than in the embodiment shown in FIG. 1 can be realized.

Figure 16A:
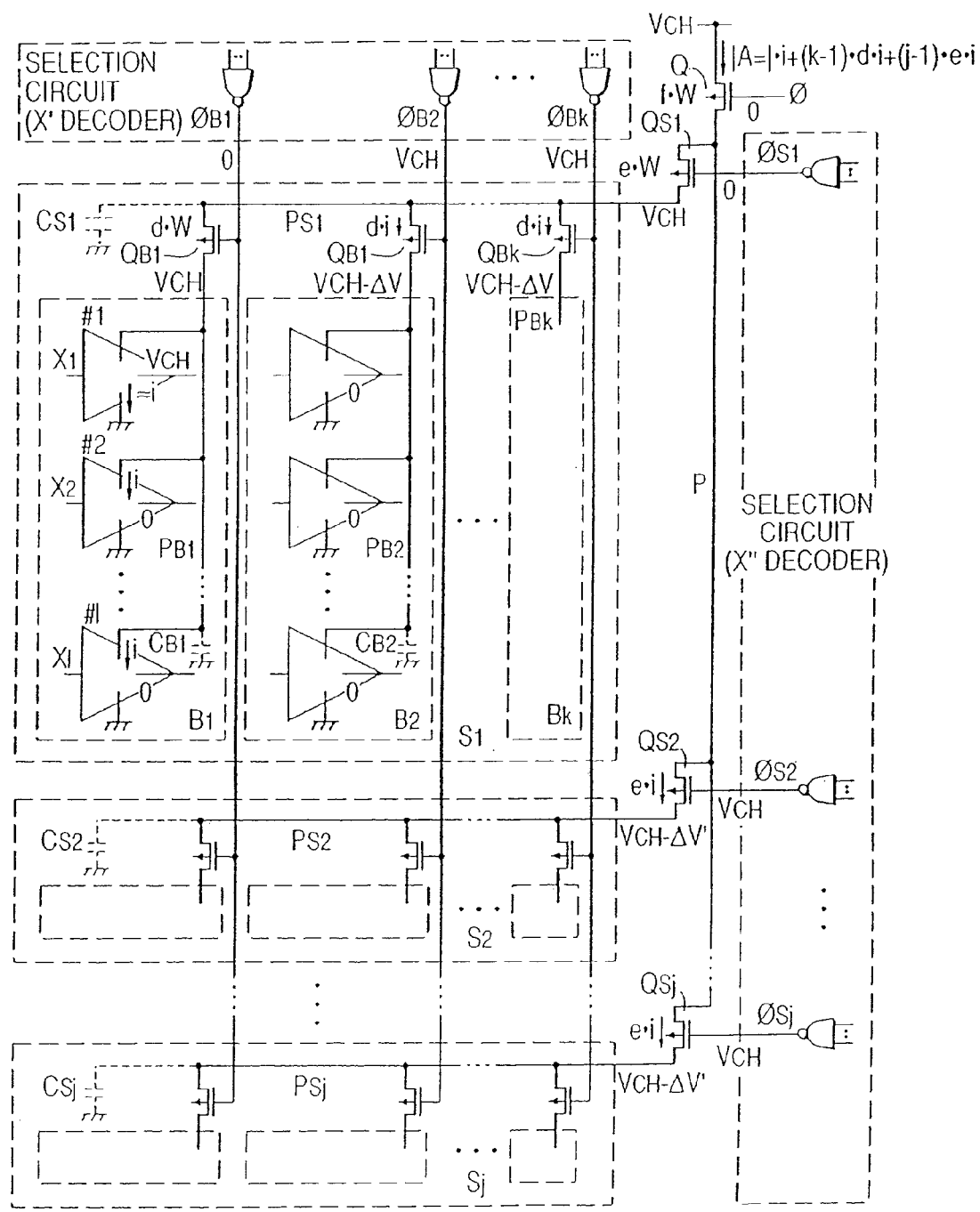
FIG. 16A shows an embodiment of a two-dimensional arrangement of word driver blocks.
Figure 16B:
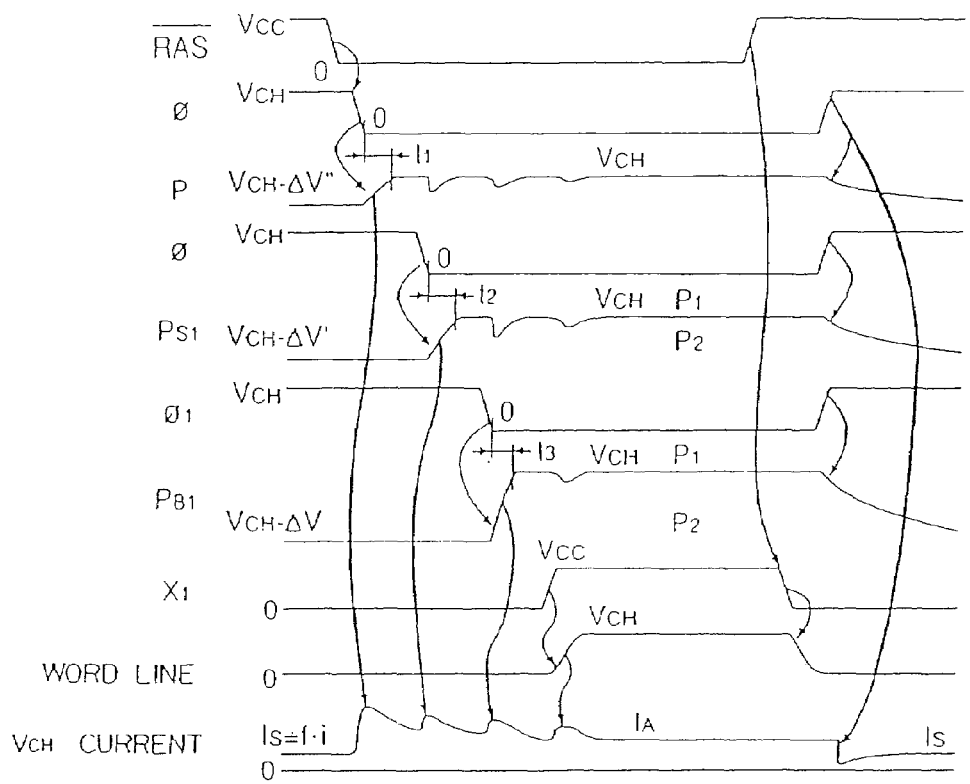
FIG. 16B is a timing chart for the operation of the embodiment shown in FIG. 16.

FIG. 16A is another embodiment of the selection system of the two-dimensional arrangement, and FIG. 16B is a timing chart for the operation of this embodiment. In this embodiment, a plurality of the arrangement for the one-dimensional selection shown in FIG. 5A are provided, and transistors are further provided between the power supply and the power terminals. In this case, the transistor Q in FIG. 5 corresponds to the transistors $Q_{s1}$ through $Q_{sj}$ in FIG. 16A. In the same manner as shown in the embodiment of FIG. 14, only the block at an intersection is selected by a row power line (for example, $P_{s1}$) and a column control line (for example, $\Phi_{B1}$) This embodiment is different from the embodiment shown in FIG. 14 in the point given below. In FIG. 14, when each block is not selected, the power line of each block is at 0 V, and even when the block selecting operation is started, all the power lines for the nonselected blocks are at 0 V. When either one of the blocks is selected, that power line must be charged from 0 V to $V_{CH}$, and thus there is the drawback that the operation speed is low and that the transient current becomes large. In order to solve this problem, when a certain block is shifted from the nonselected state to the selected state, it is desired that the voltage change of that power line be suppressed to be as small as possible and that the subthreshold current of the other nonselected blocks is suppressed to be negligibly small. The embodiment shown in FIG. 16A is able to realize this operation, and has two features as follows.

(1) The hierarchical type power lines to blocks of drivers each: j·k blocks of a single word driver each are provided in a matrix shape. These blocks are divided into j groups, or sectors of k blocks each. The power lines $P_{B1}$ through $P_{Bk}$ for the blocks of each sector are connected through block selection transistors $Q_{B1}$ through $Q_{Bk}$ to the power line of the sector (for example, $P_{s1}$) In addition, the power line $P_{s1}$ through $P_{sj}$ of each sector is connected through a sector selection transistor $Q_{s1}$ through $Q_{sj}$ to the power line P. Moreover, the power line P is connected through the transistor Q for selecting one of the operating mode and the standby mode to the power line of word voltage $V_{CH}$.

(2) The setting of hierarchical gate width: the gate width (d·w) of the block selecting transistor is selected to be much smaller than the total gate width (l·W) of the word driver transistor within the block (d<l). In addition, the gate width (e·W) of the sector selection transistor is selected to be much smaller than the total gate width (k·d·W) of the block selection transistor within the sector (e<k·d). Moreover, the gate width (f·W) of the transistor Q is selected to be much smaller than the total gate width (j·e·W) of all sector selection transistors (f<j·e).

Upon operation, the transistors Q, $Q_{s1}$, $Q_{B1}$ are turned on, permitting $V_{CH}$ to be applied to the power lines $P_{B1}$ and $P_{S1}$, corresponding to the block $B_1$ including the selected word driver (#1) and the sector $S_1$ including $B_1$. Here, $V_T$ of all transistors is assumed to be the same low value. Thus, the total subthreshold current of the nonselected sector ($S_1$ through $S_j$) equals to the subthreshold current of the corresponding single sector selection transistor ($Q_{s2}$ through $Q_{sj}$) In addition, the subthreshold current of each of the nonselected blocks ($B_2$ through $B_k$) within the selected sector ($S_1$) equals to the subthreshold current of the corresponding single block selection transistor ($Q_{B2}$ through $Q_{Bk}$). This is because the subthreshold current is proportional to the gate width of the transistor. Therefore, even though a current of l·i tends to flow in the nonselected blocks within, for example, the sector $S_1$, the total subthreshold current is limited by the subthreshold current (d·i) of the block selection transistor. As a result, the total subthreshold current $I_A$ is substantially (1+k·d+j·e) i when k>l, j>l as listed on Table 2. If d, e and f are selected to be about 4, the effect on the operation speed of the series transistor (Q, $Q_{s1}$, $Q_{B1}$) and the chip area can be reduced.

When the word driver number (j·k·l) is constant, the product of the subthreshold current l·i of the selected block within the selected sector, the total subthreshold current k·d·i of the nonselected blocks within the selected sector and the total subthreshold current j·e·i of the nonselected sectors is constant. Therefore, in order to reduce $I_A$, it is necessary that the subthreshold current l·i of the selected block within the selected sector, the total subthreshold current k·d·i of the nonselected blocks within the selected sector and the total subthreshold current j·e·i of the nonselected sectors be set at substantially the same value, or l≈k·d≈j·e. The total subthreshold current $I_A$ is increased with the increase of the deviation from this condition. The setting of the sector number j and block number k depends on the decoders within the selected circuit and the layout area. The total subthreshold current $I_A$ is desired to be set at about five times or below as large as the minimum value. To this end, the largest one of the subthreshold current of the selected block within the selected sector, the total subthreshold current of the nonselected blocks within the selected sector and the total subthreshold current of the nonselected sectors should be selected to be within 15 times the value at which the total subthreshold current $I_A$ is the minimum. Thus, the ratio of the largest one to the smallest one of the three subthreshold currents, or the subthreshold current of the selected block within the selected sector, the total subthreshold current of the nonselected blocks within the selected sector and the total subthreshold current of the nonselected sectors should be less than about 60 (15÷($\sqrt{15}$)).

Figure 18A:
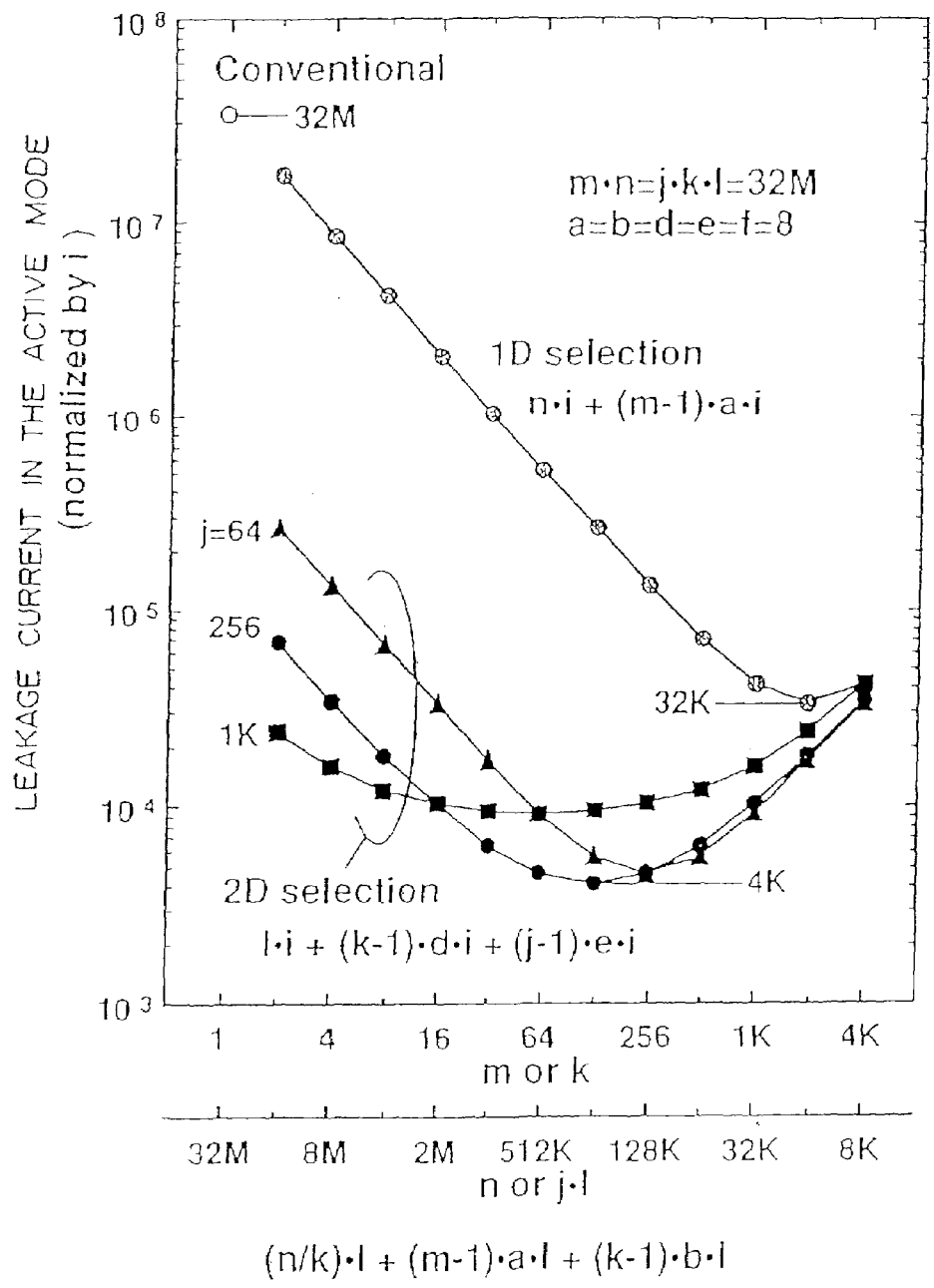
FIG. 18A is a graph showing the block-number dependency of the leakage current for two-dimensional selection with the sector number being used as a parameter.
Figure 18B:
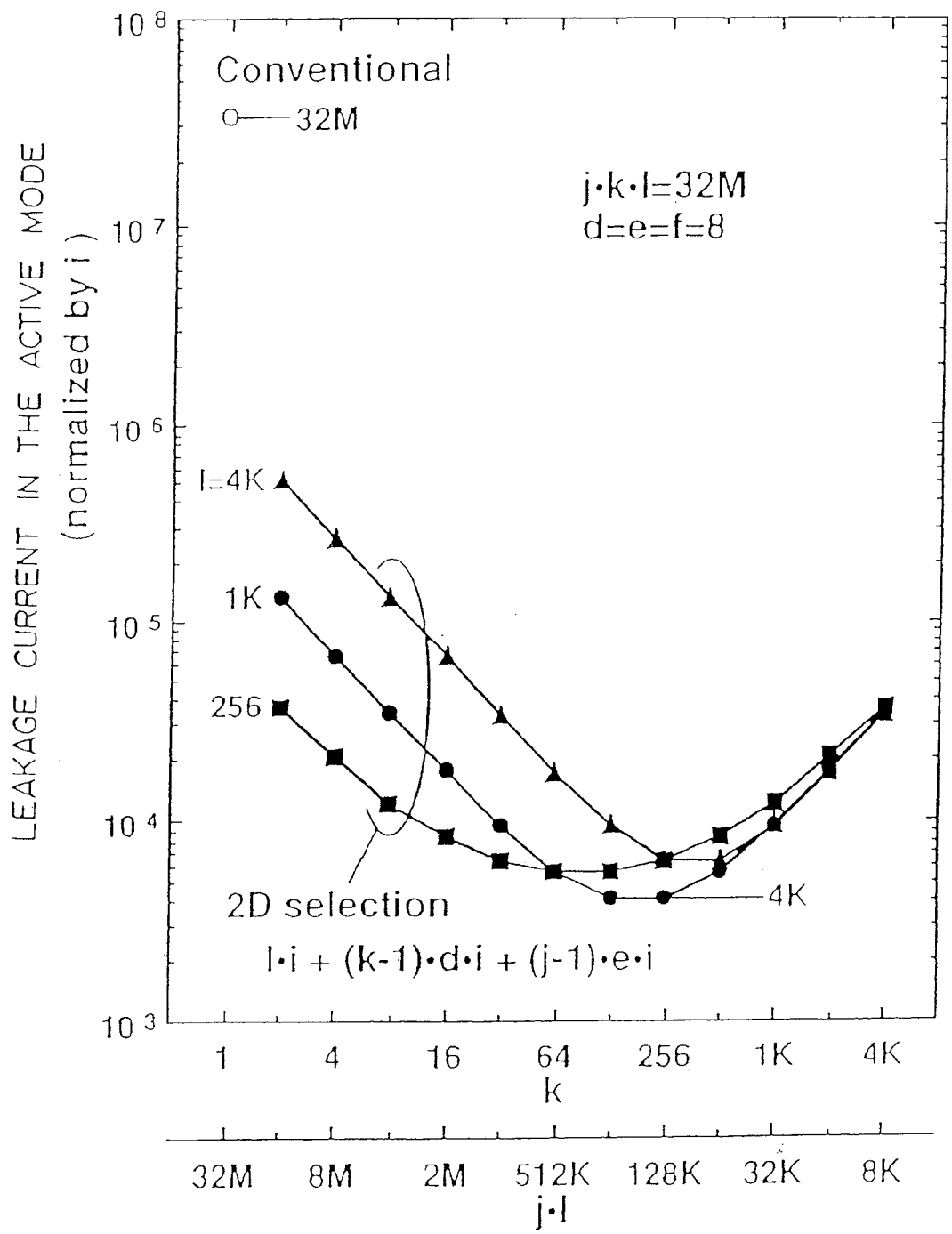
FIG. 18B is a graph showing the block-number dependency of the leakage current for two-dimensional selection with the circuit number within a block being used as a parameter.

FIGS. 18A and 18B show graphs of the dependency of the operating subthreshold current $I_A$ on the sector number and block number when the word driver number (m·n) is $32 \times 10^6$. In FIG. 18A, the block number k and word driver number l are changed for a particular sector number j. In FIG. 18B, the sector number j and block number k are changed for the word driver number l within a particular block. In addition, in FIG. 18A, the one-dimensional selection shown in FIG. 5A is also shown for reference. The coefficients d, e and f of the gate width are selected to be 8, and the interconnection resistance and interconnection capacitance are neglected. When j=256, K=128 and l=1K so that l≈k·d≈j·e, the minimum can be obtained. At this time, it can be reduced to ⅛K the value in the prior art, or ⅛ the minimum value in the one-dimensional selection.

Figure 17:
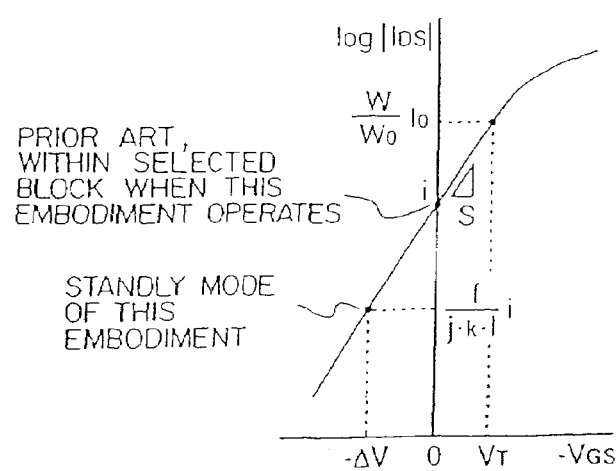
FIG. 17 is a graph showing the operating point of the p-channel MOS transistor of the word driver in the embodiment shown in FIG. 16.

In the standby mode, all the transistors Q, $Q_1$ through $Q_k$ are made almost in the off-state. The total subthreshold current $I_s$ equals to the subthreshold current of the transistor Q, and thus it can be reduced by f/j·k·l as compared with the prior art. The voltage on the power line of the block is reduced from $V_{CB}$ by ΔV which is determined by the ratio between j·k·l·W and f·w and subthreshold swing as shown in FIG. 17. This ΔV is different from that in FIG. 6.

The transistor Q is provided so that the subthreshold currents in both the standby mode and operating mode can be minimized at a time like the transistor Q in the embodiment shown in FIG. 5A. Thus, the current limiting function becomes a three-stage function. The subthreshold current in the standby mode is not dependent on j, k and l, and thus the relation of j, k and l can be established to be l≈k·d≈j·e under the conditions that the-subthreshold current in the standby mode is small and that the subthreshold current in the operating mode is the minimum.

Table 2 lists the current values obtained for a 16 gigabit DRAM. The parameters used are as follows. The threshold voltage $V_T$ which is defined by a voltage at which a current of 10 nA flows in a gate width of 5 μm is −0.12 V, the subthreshold swing S is 97 mV/dec., the junction temperature T is 75° C., the effective gate length $L_{eff}$ is 0.15 μm, the gate oxide film thickness $T_{OX}$ is 4 nm, the word voltage $V_{CH}$ is 1.75 V, and the source voltage $V_{cc}$ is 1 V. According to this invention, the subthreshold current in the operating mode can be reduced to about ¹⁄₃₅₀ as small as about 700 mA in the prior art, or about 2 mA, and the subthreshold current in the standby mode can be reduced to about 1/33000 that in the prior art, or about 20 μA.

TABLE 2

| | Operating current | Standby current | Amount of charge to charge | | |
|---|---|---|---|---|---|
| | ($I_A$) | ($I_S$) | $t_1$ | $t_2$ | $t_3$ |
| Prior art | j · k · l · i (695 mA) | j · k · l · i (695 mA) | 0 | 0 | 0 |
| This invention | l · i + (k − 1) · d · i + (j − 1) · e · i (1.99 mA) | f · i (21.2 μA) | $C_{S1} \cdot \Delta V''$ | $C_{B1} \cdot \Delta V'$ | $C_1 \cdot \Delta V$ |

(These values are expected ones of a 16 Gb DRAM.)

FIG. 18 shows operating waveforms. In the standby mode ($\Phi$, $\Phi_{s1}$ through $\Phi_{sj}$, $\Phi_{B1}$ through $\Phi_{Bk}$: $V_{CH}$), the transistors Q, $Q_{s1}$ through $Q_{sj}$ and $Q_{B1}$ through $Q_{bk}$ are substantially in the off-state. Thus, the power line P is at a lower voltage $V_{CH}$-delta V" lower than $V_{CH}$, the power lines $P_{S1}$ through $P_{Sj}$ at a further lower voltage $V_{CH}$-$\Delta V'$ than that, and $P_{B1}$ through $P_{Bk}$ at a further much lower voltage $V_{CH}$-$\Delta V$. All the word lines are fixed to a voltage $V_{ss}$ independently of the voltage of the power lines $P_{B1}$ through $P_{Bk}$. When the external clock signal /RAS (here "/" indicates the bar signal) is turned on, the transistor Q is turned on at $\Phi$, permitting the parasitic capacitance C of the power line P to be charged for time t1 to reach $V_{CH}$. Then, the transistor $Q_{s1}$ is turned on at $\Phi_{s1}$, permitting the parasitic capacitance $C_{s1}$ of the power line $P_{s1}$ to be charged for time $t_2$ to reach $V_{CH}$. In addition, the transistor $Q_{B1}$ is turned on at $\Phi_{B1}$, permitting the parasitic capacitance $C_{B1}$, of the power line $P_{B1}$ to be charged for time $t_3$ to reach $B_{CH}$. At this time, the transistors $Q_{s2}$ through Qsj and $Q_{B2}$ through $Q_{Bk}$ remain almost in the off-state. Thereafter, the word driver #1 is selected by the X decoder output signal $X_1$, driving the word line. When the external clock signal /RAS is turned off, the transistors Q, $Q_{s1}$ and $Q_{B1}$ are turned off. The power lines P, $P_{s1}$ and $P_{B1}$, after lapse of a long time, become at $V_{CH}$-$\Delta V''$, $V_{CH}$-$\Delta V'$ and $V_{CH}$-$\Delta V$. Here, the power lines (P, $P_1$) can be charged to $V_{CH}$ without reducing the access time because delta V" is as small as several hundred mv even if C is large and because the charging time $t_1$ for P can be maintained to be long enough immediately after the external clock signal /RAS is turned on. Moreover, since the arrangement is formed of sectors and blocks, the parasitic capacitance $C_{s1}$)$C_{B1}$ are relatively small and thus the charging time ($t_2$, $t_3$) for $P_{s1}$, $P_{B1}$ can be decreased.

In this embodiment, it is also desired that all substrate for the p-channel MOS transistors be connected to $V_{CH}$ as is similar to the one-dimensional arrangement. In this case, the amount of charge necessary for charging the power lines is smaller and the charging time can be more reduced, than when the substrate is connected to the power lines to which the drains are connected. As described above, when the voltages on the power lines for the nonselected blocks are reduced by $\Delta V$ from $V_{CH}$, the threshold voltages of the p-channel MOS transistors within the nonselected blocks are increased by the body effect. Since the threshold voltages are increased in addition to the fact that the source voltage is lower than the gate voltage, the same current reducing effect can be achieved by small $\Delta V$ as compared with the case in which the substrate voltage is equal to the drain voltage.

Since the word voltage $V_{CH}$ is produced by boosting the source voltage $V_{cc}$, a higher voltage than in the other circuits is applied to the gates of the MOS transistors of the word drivers. Thus, the $V_T$ can be increased the more and the current can be decreased. However, the operating speed can be slightly decreased.

This drawback can be negligibly obviated by decreasing the threshold voltage of the transistors within the word driver and by increasing the threshold voltage of the transistors used as switching transistors to a higher voltage than that. If the threshold voltages of the transistors Q, $Q_{s1}$ through $Q_{sj}$ and $Q_{B1}$ through $Q_{Bk}$ shown in FIG. 16 are increased to be higher than those of the transistors within the word driver and if d, e and f are set at large values, the operating speed can be prevented from being decreased due to the on-resistance of the switch, and also the subthreshold current can be further decreased. This is because the subthreshold current is exponentially affected by the threshold voltage at the off-state, but the on-resistance is affected only linearly. If the charging time $t_1$, $t_2$, $t_3$ in FIG. 18 can be assured irrespective of whether the gate capacitance increases with the increase of gate width, the operating speed cannot be reduced. Therefore, the subthreshold current can be further reduced without decreasing the operating speed. There is also no problem with the layout area because the number of elements is relatively small. In some case, the standby current can be reduced by using a high threshold voltage transistor for the transistor Q.

In this embodiment, while a single p-channel MOS transistor is used as a switch, other various elements or circuits can be considered provided that they meet the following two conditions.

(1) When the switch is selected: when the switch is assumed to be short-circuited, the current driving ability of the switch is greater than the active current (the subthreshold current and the charging current of the word line selected) flowing in the load (for example, a single word driver for the block selecting switch) of the switch.

(2) When the switch is not selected: when the switch is assumed to be short-circuited, the current supplying ability of the switch is smaller than the standby current (the subthreshold current) flowing in the load.

The impedance should be changed to a low value and a large value upon selection and upon non-selection, respectively so that these two conditions can be met.

In the operation shown in FIGS. 18A and 18B, the voltages $\Phi$, $\Phi_{s1}$, $\Phi_{B1}$ are left low and the transistors Q, $Q_{s1}$, $Q_{B1}$, are kept on during the active period in which the clock signal/RAS is 0 V. This operation can be achieved if the voltage $\Phi$ is controlled by the signal which is produced by the clock /RAS and which specifies the operating mode at the active time and at the standby time, and if the voltages $\Phi_{s1}$ and $\Phi_{B1}$ are controlled by a combination signal of that signal and an address signal. In addition, by using the signal for specifying the period from when the clock /RAS falls off to when the driving of the word line ends, after the word line driving it is possible that the voltages $\Phi$, $\Phi_{s1}$, $\Phi_{B1}$ are increased to $V_{CH}$ and that the transistors Q, $Q_{s1}$, $Q_{B1}$ are turned off. Thus, even at the active time the subthreshold current after the word line driving can be reduced to the same extent as the standby current $I_s$. This effect is the larger, the longer the active period in which the clock /RAS is 0 V. In this case, in order to make rewriting in the memory cell, it is necessary that the voltages $\Phi$, $\Phi_{s1}$, $\Phi_{B1}$ be reduced for a constant period of time from the leading edge of the clock/RAS so that the transistors Q, $Q_{s1}$, $Q_{B1}$ are turned on.

Figure 19:
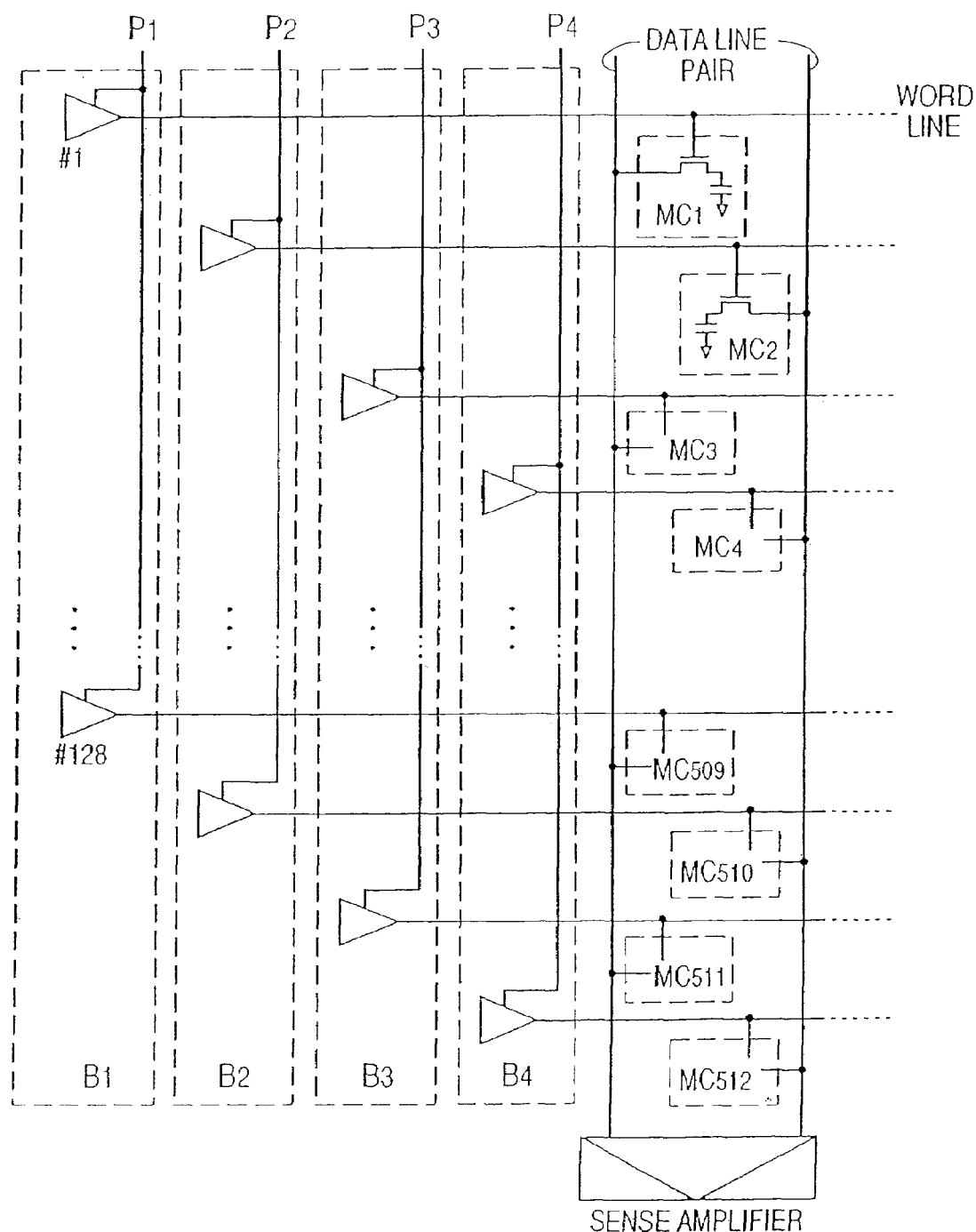
FIG. 19 shows an arrangement of the division of 512 word drivers into four blocks.

FIG. 19 shows an arrangement in which 512 word drivers are divided into four blocks. That is, 512 memory cells ($MC_1$, through $MC_{512}$) are provided for a pair of data lines, and selected by 512 word lines. The memory cells are arranged at a high density by reducing the word line width and the spacing between the word lines to the same extent as the feature size. Therefore, the word drivers cannot be laid out at the same pitch as the word lines, and thus they are generally laid out substantially in four separate stages. In FIG. 19, each stage of the layout corresponds to the block ($B_1$ through $B_4$) of the word drivers. The layout area is not increased if separate power lines are used for the blocks. Thus, the value of l can be made smaller than the memory cell count per data line pair. It will be clear that this value can be contrarily increased, and thus the degree of freedom of the value of l is large. Therefore, the subthreshold current $I_A$ upon operation can be minimized by properly setting the l, (k·d) and (j·e).

The two-dimensional arrangement of word drivers has been mentioned above. This arrangement can be applied to the following case.

Figure 20:
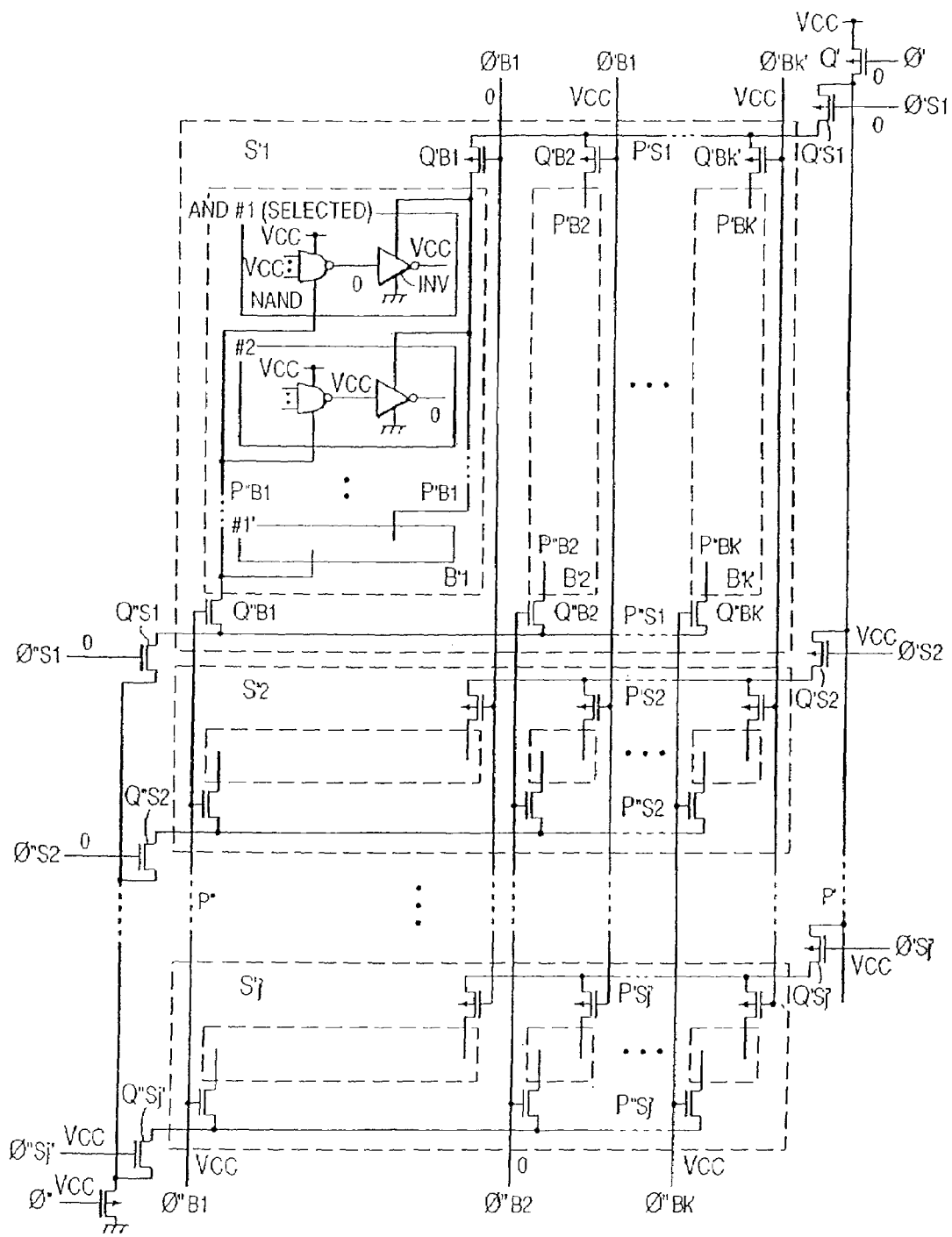
FIG. 20 shows an embodiment of a two-dimensional arrangement of decoder blocks.

FIG. 20 shows an example of the hierarchical type power line system of the same two-dimensional arrangement applied to decoders as in FIG. 16. An AND circuit is formed of two stages of a NAND circuit and inverter of a CMOS logic circuit. The feature of this arrangement is that the hierarchical type power lines are provided on both sides of $V_{cc}$ and $V_{ss}$. All NAND circuits produce $V_{cc}$ in the standby mode, and a small number of the NAND circuits produce 0 V in the operating mode. Since the subthreshold current is determined by the n-channel MOS transistor on $V_{ss}$ side, the hierarchical type power lines are used on $V_{ss}$ side. On the contrary, all the inverters produce 0 V in the standby mode, and a small number of ones of the inverters produce $V_{cc}$ in the operating mode. Since the subthreshold current is determined by the p-channel MOS transistor, the hierarchical type power lines are used on $V_{cc}$ side. Thus, since the hierarchical type power lines are used on both sides of $V_{cc}$ and $V_{ss}$, use of multiple-stage logic circuits will not make the operation unstable and the subthreshold current can be reduced.

Even in the circuit operating at around the central point of Vcc/2 such as the sense amplifier drive circuit, this invention is applied to both sides of $V_{cc}$ and $V_{ss}$, thus reducing the subthreshold current. This invention can be applied to a circuit group if the circuits of the circuit group output the same voltage in the standby mode, and if a small number of ones of the circuits are operated in the operating mode. At this time, all the circuits are not necessary to be of the same transistor size, but may be of different configurations. In addition, the number of circuits within the block and the number of blocks within the sector may be different.

When a plurality of circuits are simultaneously operated, a plurality of circuits within a single block may be operated or a plurality of blocks may be selected at a time. In addition, the transistors operating as switches may be grouped into a plurality of blocks and arranged separately. In this case, the interconnection resistance can be reduced by using power lines of a short length, and thus the power lines of the selected block can be charged in a short time.

Figure 21:
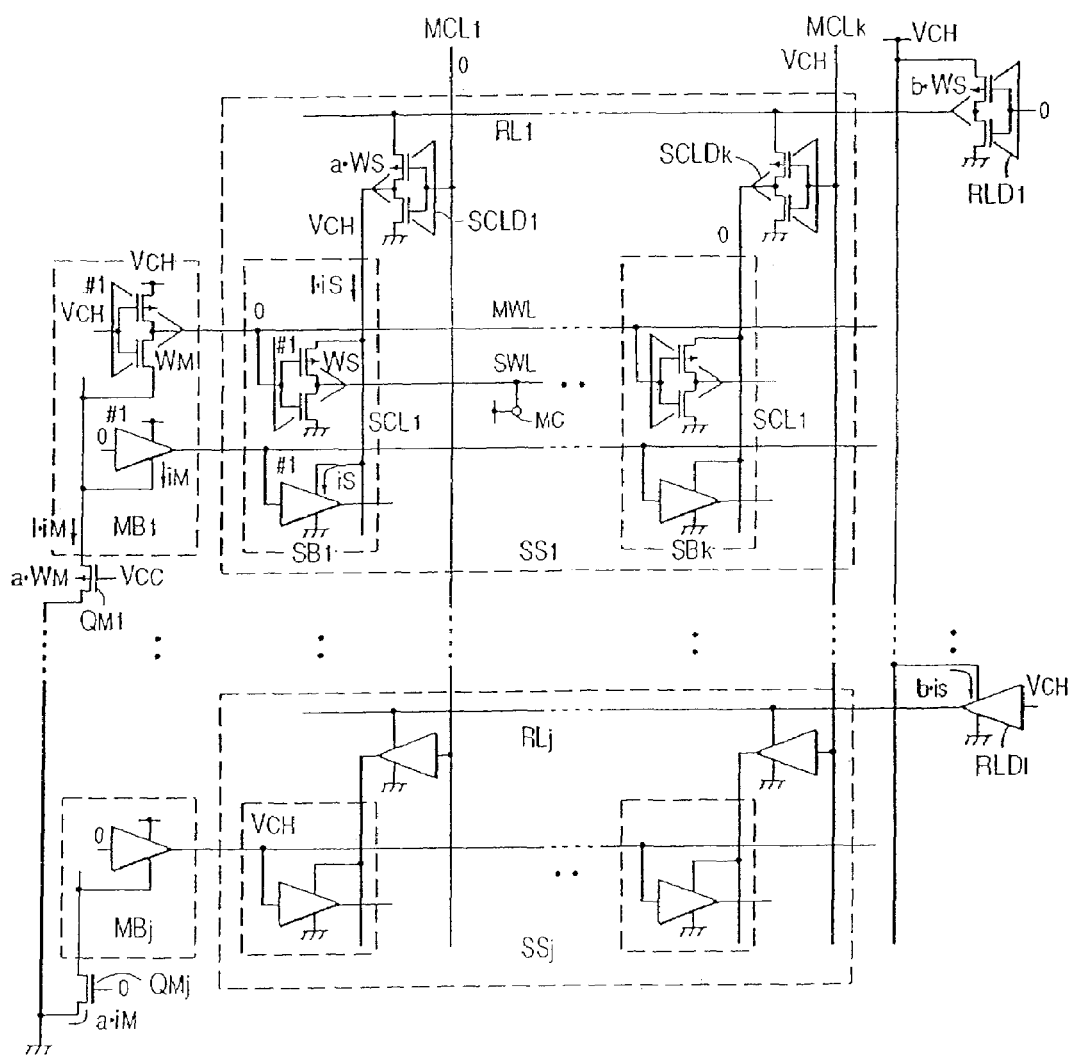
FIG. 21 shows an embodiment of the application to the hierarchical type word line arrangement.

Another example will be mentioned in which both the one-dimensional selection and the two-dimensional selection can be made in one semiconductor integrated circuit. FIG. 21 schematically shows an application of the invention to the hierarchical type word line structure. The hierarchical type word line structure is described in 1993 IEEE International Solid-State Circuits Conference, Digest of Technical Papers, pp. 50-51 (February 1993) or in Eighteenth European Solid State Circuits Conference, proceedings, pp. 131-134 (September 1992).

The main drivers are formed of j blocks $MB_1$, through $MB_j$, of one driver each. The NMOS transistors $Q_{M1}$ through $Q_{Mj}$ are block selection transistors. The subword drivers are formed of J·k blocks of one driver each in a matrix shape. In addition, these blocks are divided into j sectors $SS_1$, through $SS_j$ of k blocks $SB_1$ through $SB_k$ each. The PMOS transistors of row address drivers $RLD_1$ through $RLD_j$ serve as sector selecting transistors, and the PMOS transistors of subcolumn drivers $SCLD_1$ through $SCLD_k$ serve as block selecting transistors.

The operation will be mentioned. For example, the subcolumn driver $SCLD_1$, is selected, and the subcolumn address line $SCL_1$ is driven, by the main column address line $MCL_1$ and the row address line $RL_1$ driven by the row address driver $RLD_1$. In addition, a subword driver is selected to drive one subword line SWL, and the memory cell MC is selected, by the subcolumn address line $SCL_1$, and main word line MWL.

The subthreshold current after the subword line SWL is driven is, as described above, reduced by the one-dimensional selection of the main word driver block and the two-dimensional selection of the subword driver block. In other words, this current is the sum of the current of $1 \cdot i_M$ flowing in the nonselected block $MB_1$ of the main word driver, the current of $(j-1) \cdot a \cdot i_M$ flowing in the nonselected blocks $MB_2$ through $MB_j$ of the main word driver, the current of $1 \cdot i_S$ flowing in the selected block $SB_1$ of the selected sector $SS_1$ of the subword driver, the current of $(k-1) \cdot a \cdot i_s$ flowing in the nonselected blocks $SB_2$ through $SB_k$ of the selected sector $SS_1$ of the subword driver, and the current of $(j-1) \cdot b \cdot i_S$ flowing in the nonselected sectors $SS_2$ through $SS_j$ of the main word driver.

The reason why the block selection transistor of the main word driver is provided as an NMOS transistor on the ground side is that since the nonselected main word driver produces $V_{CH}$, the subthreshold current is determined by the NMOS transistor on the ground side.

The subword drivers are originally two-dimensionally arranged, and the selection lines therefor serve both as themselves and as power lines. Thus, the two-dimensional selection of the invention can be easily applied to the subword drivers. Moreover, since the number is large, the effect of reducing the subthreshold current is great. In this case, if the main word drivers are divided likewise, the one-dimensional selection of the invention can be realized. In that case, since the signal for selecting the blocks of the main word drivers is the complementary signal of the signal for selecting the sector of the subword drivers, it can be generated by a common circuit.

The hierarchical type word line arrangement has the effect that the charging and discharging currents can be reduced by decreasing the number of the memory cells to be selected as compared with the conventional word line construction. In addition, the hierarchical type word line arrangement is suitable in the application of the selective power supplying of the invention for reducing the subthreshold current.

In this embodiment, the column address lines are hierarchically arranged. Therefore, the interconnection resistance and capacitance of the subcolumn address lines are small, and thus the operation speed can be increased. One of the advantages of the hierarchical type word line structure is that the interconnection delay of the subword lines is small enough for high operation speed. In this embodiment, the hierarchical type word line structure is further improved for high speed operation.

This invention can be applied not only to the DRAM, but also to the static random access memory (SRAM), the read only memory (ROM), the flush memory and the memory-incorporated logic LSI. This invention is also applied to other logic circuits than the CMOS circuits such as n-channel MOS logic circuits. While a positive voltage of 2.5 V relative to ground potential is applied as the operating voltage as above, a negative voltage relative to ground potential may be applied as the operating voltage. This invention can be applied to a semiconductor integrated circuit which is operated under a negative voltage of which the absolute value is lower than 2.5 V, or for example, under −2 V.

According to this invention, as will be obvious from the above description, a semiconductor integrated circuit can be realized which can reduce the subthreshold current without decreasing the operating speed, and make high speed operation with a low consumption power. The effect of the invention is the greater, the less the threshold voltage. In the LSI in which the constant-current threshold voltage at which the subthreshold current becomes dominant in the active current is less than about 0.2 V (the extrapolated threshold voltage is lower than about 0.4 V), the effect is great. In other words, the threshold voltage is necessary to be determined from the view point of the operating speed when the operating voltage is about 2.5 V or below or from the scaling rule when the gate length is about 0.25 μm or below, and hence the effect is extremely large in that LSI.

What we claim is:

1. A semiconductor integrated circuit operating at an operating voltage of which the absolute value is about 2.5 V or below, comprising:
   a plurality of circuit blocks to which operation voltage is supplied by a first power line and a second power line; and
   a first switching element for each said circuit block;
   wherein each circuit block includes a first MOS transistor in which a leakage current flows between a drain and a source of said first MOS transistor, including under a condition that a gate voltage is equal to a source voltage in said first MOS transistor,
   wherein each of said first switching elements is adapted to control the leakage current flowing through a corresponding one of said first MOS transistors of said each circuit block,
   wherein, while one of said first switching elements is controlled to reduce said leakage current flowing through the circuit block relating to one of said first switching elements, another one of said first switching elements is controlled to allow current to flow thorough the circuit block relating to another one of said first switching elements, and
   wherein said current which is allowed to flow by said another one of said first switching elements is sufficient to permit said circuit block relating to another one of said first switching elements to logically operate.

2. A semiconductor integrated circuit operating at an operating voltage of which the absolute value is about 2.5 V or below, comprising:
   a plurality of circuit blocks to which operation voltage is supplied by a first power line and a second power line; and
   a first switching element for each said circuit block;
   wherein each circuit block includes a first MOS transistor in which a leakage current flows between a drain and a source of said first MOS transistor, including under a condition that a gate voltage is equal to a source voltage in said first MOS transistor,
   wherein each of said first switching elements is adapted to control the leakage current flowing through a corresponding one of said first MOS transistors of said each circuit block,
   wherein said each first switching element is a second MOS transistor of which the source/drain path is connected between said first power line and said circuit block relating to said each first switching element; and
   wherein, while at least one of the circuit blocks is selected, said first switching element controlling said at least one of the circuit blocks is adapted to allow the voltage of said first power line to be applied to said circuit block through said first switching element, while the second MOS transistors of the first switching element controlling the circuit blocks not selected are turned off.

3. A semiconductor integrated circuit operating at an operating voltage of which the absolute value is about 2.5 V or below, comprising:
   a plurality of circuit blocks to which operation voltage is supplied by a first power line and a second power line;
   wherein each circuit block includes a first MOS transistor in which a leakage current flows between the drain and the source of said first MOS transistor, including under a condition that a gate voltage is equal to a source voltage in said first MOS transistor; and
   a plurality of first switching elements,
   wherein each first switching element corresponding to each circuit block is adapted to control the leakage current flowing through a corresponding one of said first MOS transistors of said each circuit block,
   wherein, while one of said first switching elements is controlled to reduce said leakage current flowing through the circuit block corresponding to one of said first switching elements, another one of said first switching elements is controlled to allow current to flow through the circuit block corresponding to another one of said first switching elements, and
   where said current which is allowed to flow by said another one of said first switching elements is sufficient to permit said circuit block corresponding to another one said first switching elements to logically operate.

4. A semiconductor integrated circuit operating at an operating voltage of which the absolute value is about 2.5 V or below, comprising:
   a plurality of circuit blocks to which operation voltage is supplied by a first power line and a second power line,
   wherein each circuit block includes a first MOS transistor in which a leakage current flows between a drain and a source of said first MOS transistor, including under a condition that a gate voltage is equal to a source voltage in said first MOS transistor; and
   a plurality of first switching elements;
   wherein each first switching element corresponding to said each circuit block is adapted to control the leakage current flowing through a corresponding one of said first MOS transistors of said each circuit block,
   wherein said each first switching element is a second MOS transistor of which the source/drain path is connected between said first power line and said circuit block corresponding to said each first switching element; and
   wherein, while at least one of the circuit blocks is selected, said first switching element controlling said at least one of the circuit blocks is adapted to allow the voltage of said first power line to be applied to said circuit block through said first switching element, while the second MOS transistors of the first switching element controlling the circuit blocks not selected are turned off.

* * * * *